(12) United States Patent
Ono et al.

(10) Patent No.: US 12,154,515 B2
(45) Date of Patent: Nov. 26, 2024

(54) DISPLAYS WITH REDUCED TEMPERATURE LUMINANCE SENSITIVITY

(71) Applicant: Apple Inc., Cupertino, CA (US)

(72) Inventors: Shinya Ono, Santa Clara, CA (US); Chin-Wei Lin, San Jose, CA (US); Zino Lee, San Diego, CA (US); Chun-Chieh Lin, Taoyuan (TW); Chen-Ming Chen, Taoyuan (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/990,510

(22) Filed: Nov. 18, 2022

(65) Prior Publication Data

US 2023/0080809 A1 Mar. 16, 2023

Related U.S. Application Data

(63) Continuation of application No. 17/501,530, filed on Oct. 14, 2021, now Pat. No. 11,532,282.

(60) Provisional application No. 63/123,385, filed on Dec. 9, 2020.

(51) Int. Cl.
*G09G 3/3291* (2016.01)
*G09G 3/3266* (2016.01)

(52) U.S. Cl.
CPC ......... *G09G 3/3291* (2013.01); *G09G 3/3266* (2013.01); *G09G 2300/0876* (2013.01); *G09G 2320/041* (2013.01)

(58) Field of Classification Search
CPC .. G09G 3/3233; G09G 3/3291; G09G 3/3258; G09G 3/32; G09G 3/3225; G09G 3/3275; G09G 2300/0819; G09G 2300/0842; G09G 2300/0861; G09G 2300/0852; G09G 2300/0866; G09G 2300/0426; G09G 2320/043; G09G 2320/0233; G09G 2320/045; G09G 2310/0262
See application file for complete search history.

(56) References Cited

U.S. PATENT DOCUMENTS

| 6,731,533 B2 | 5/2004 | Deng et al. |
|---|---|---|
| 10,262,587 B2 | 4/2019 | Nathan et al. |
| 10,708,529 B2 | 7/2020 | Madurawe |

(Continued)

FOREIGN PATENT DOCUMENTS

| EP | 3637469 A1 | 4/2020 |
|---|---|---|
| JP | 2005227562 A | 8/2005 |

(Continued)

*Primary Examiner* — Dong Hui Liang
(74) *Attorney, Agent, or Firm* — Treyz Law Group; Jason Tsai

(57) ABSTRACT

A display may include an array of pixels. Each pixel in the array includes an organic light-emitting diode coupled to a drive transistor, a data loading transistor, a first capacitor for storing data charge, and a second capacitor. During a data programming phase, the data loading transistor may be activated to load in a data value onto the first capacitor. After the data programming phase, the second capacitor may be configured to receive a lower voltage, which extends a threshold voltage sampling time for the pixel. Configured and operated in this way, the temperature luminance sensitivity of the display can be reduced.

15 Claims, 33 Drawing Sheets

(56) References Cited

U.S. PATENT DOCUMENTS

| | | | |
|---|---|---|---|
| 2003/0095087 A1* | 5/2003 | Libsch | G09G 3/3233 345/82 |
| 2005/0280616 A1 | 12/2005 | Miwa et al. | |
| 2008/0030437 A1* | 2/2008 | Iida | G09G 3/3233 345/80 |
| 2009/0273617 A1 | 11/2009 | Tanikame et al. | |
| 2012/0287102 A1 | 11/2012 | Toyomura et al. | |
| 2015/0170578 A1 | 6/2015 | Choi | |
| 2015/0206931 A1 | 7/2015 | Choi et al. | |
| 2016/0063922 A1 | 3/2016 | Tsai et al. | |
| 2017/0092200 A1 | 3/2017 | Park et al. | |
| 2018/0061908 A1 | 3/2018 | Shim et al. | |
| 2018/0190194 A1 | 7/2018 | Zhu et al. | |
| 2018/0350286 A1 | 12/2018 | Lee et al. | |
| 2020/0005707 A1 | 1/2020 | Chaji et al. | |
| 2020/0226978 A1 | 7/2020 | Lin et al. | |
| 2020/0402457 A1 | 12/2020 | Ueno | |
| 2021/0272519 A1* | 9/2021 | Cao | G09G 3/3233 |
| 2022/0199020 A1 | 6/2022 | You | |

FOREIGN PATENT DOCUMENTS

| | | |
|---|---|---|
| JP | 2009192854 A | 8/2009 |
| JP | 2017022382 A | 1/2017 |
| JP | 2019211775 A | 12/2019 |
| JP | 2020112795 A | 7/2020 |
| KR | 20170039052 A | 4/2017 |
| WO | 2008002422 A2 | 1/2008 |
| WO | 2011061800 A1 | 5/2011 |

\* cited by examiner

DISPLAYS WITH REDUCED TEMPERATURE LUMINANCE SENSITIVITY

This application is a continuation of patent application Ser. No. 17/501,530, filed Oct. 14, 2021, which claims the benefit of provisional patent application No. 63/123,385, filed Dec. 9, 2020, which are hereby incorporated by reference herein in their entireties.

BACKGROUND

This relates generally to electronic devices with displays and, more particularly, to display driver circuitry for displays such as organic light-emitting diode (OLED) displays.

Electronic devices often include displays. For example, cellular telephones and portable computers typically include displays for presenting image content to users. OLED displays have an array of display pixels based on light-emitting diodes. In this type of display, each display pixel includes a light-emitting diode and associated thin-film transistors for controlling application of data signals to the light-emitting diode to produce light. It can be challenging to design a satisfactory OLED display for an electronic device.

SUMMARY

An electronic device may include a display having an array of display pixels. The display pixels may be organic light-emitting diode display pixels. Each display pixel may include at least an organic light-emitting diode (OLED) that emits light and associated thin-film transistors for controlling the operation of the pixel.

In accordance with some embodiments, a display is provided that includes gate driver circuitry and multiple pixels coupled to the gate driver circuitry. At least one of the pixel can include: a drive transistor having a gate terminal, a first source-drain terminal, and a second source-drain terminal; a light-emitting diode having an anode coupled to the second source-drain terminal of the drive transistor; a first capacitor having a first terminal coupled to the gate terminal of the drive transistor and having a second terminal coupled to the anode; and a second capacitor having a first terminal coupled to the second source-drain terminal of the drive transistor and having a second terminal configured to receive a control signal from the gate driver circuitry. The gate driver circuitry can drive the control signal low on or after a data programming operation to extend a threshold voltage sampling time for the pixel.

The pixel can further include: a gate-to-drain transistor coupled across the gate terminal and the first source-drain terminal of the drive transistor; a data loading transistor having a first source-drain terminal coupled to the second source-drain terminal of the drive transistor and having a second source-drain terminal coupled to a data line; a first emission transistor having a first source-drain terminal coupled to a positive power supply line and having a second source-drain terminal coupled to the first source-drain terminal of the drive transistor; a second emission transistor having a first source-drain terminal coupled to the second source-drain terminal of the drive transistor and having a second source-drain terminal coupled to the anode; and an initialization transistor having a first source-drain terminal coupled to the anode and having a second source-drain terminal coupled to a voltage line.

In accordance with some embodiments, a method of operating a display pixel is provided. The display pixel can include a light-emitting diode, a drive transistor coupled in series with the light-emitting diode, a gate-to-drain transistor coupled across gate and drain terminals of the drive transistor, a data loading transistor, a first capacitor coupled to the gate terminal of the drive transistor, and a second capacitor coupled to a source terminal of the drive transistor. The method can include: during a data programming and threshold voltage sampling phase, using the data loading transistor to load data into the display pixel while the gate-to-drain transistor is activated; deactivating the data loading transistor; and applying a control signal to the second capacitor to discharge the first capacitor after deactivating the data loading transistor. The control signal can be generated using a gate driver formed in the periphery of the pixel array. The control signal may optionally be routed to the gate terminal of the data loading transistor. The method can further include performing an on-bias stress operation before the data programming and threshold voltage sampling phase by activating the data loading transistor while the gate-to-drain transistor is deactivated.

In accordance with some embodiments, a display pixel is provided that includes: a substrate; a semiconducting oxide layer that is formed above the substrate and that forms an active region for a drive transistor, the drive transistor having a first source-drain terminal, a second source-drain terminal, and a gate terminal; a first metal layer formed above the semiconducting oxide layer, the first metal layer having a portion that forms the gate terminal of the drive transistor and a bottom terminal of a first capacitor; and a second metal layer formed above the first metal layer, the second metal layer having a portion that forms a top terminal of the first capacitor, wherein the second source-drain terminal of the drive transistor is coupled to a second capacitor, and wherein the second capacitor is configured to receive a gate driver signal.

The second capacitor can have a bottom terminal formed from another portion of the first metal layer and can have a top terminal formed from another portion of the second metal layer. The display pixel can also include a source-drain metal routing layer formed above the second metal layer and optionally a third metal layer formed between the substrate and the semiconducting oxide layer. The third metal layer can be coupled to the second source-drain terminal of the drive transistor. The second capacitor can have a bottom terminal formed from a portion of the third metal layer, the first metal layer, or the second metal layer and can have a top terminal formed from a portion of the first metal layer, the second metal layer, or the source-drain metal routing layer.

DETAILED DESCRIPTION

Figure 1:
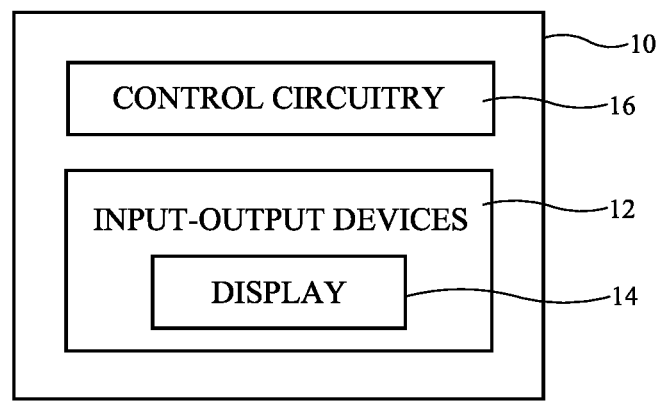
FIG. 1 is a diagram of an illustrative electronic device having a display in accordance with some embodiments.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, application processors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14. Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode (OLED) display are sometimes described herein as an example. This is, however, merely illustrative. Any suitable type of display may be used in device 10, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
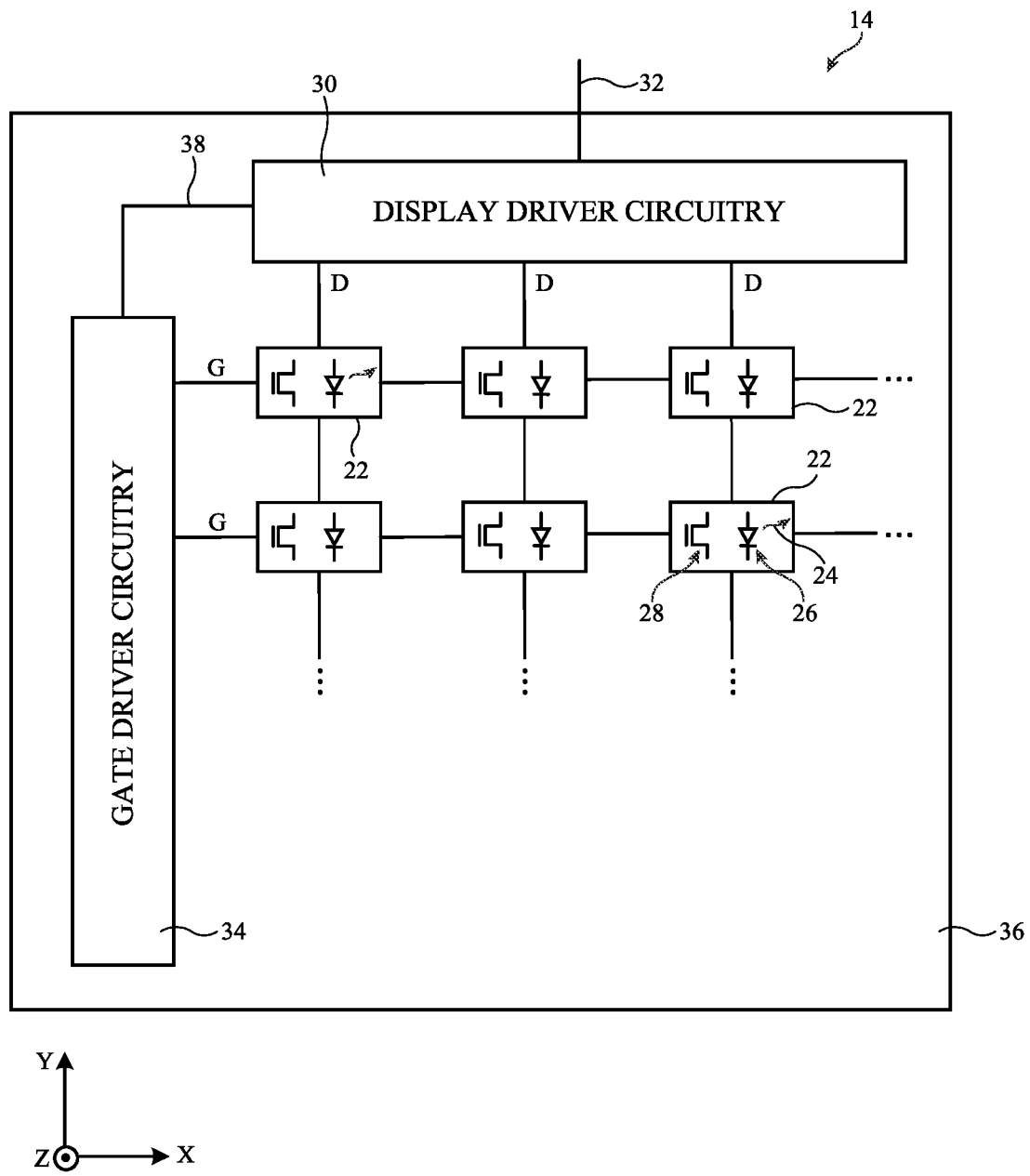
FIG. 2 is a diagram of an illustrative display having an array of organic light-emitting diode display pixels in accordance with some embodiments.

A top view of a portion of display 14 is shown in FIG. 2. As shown in FIG. 2, display 14 may have an array of pixels 22 formed on a substrate 36. Substrate 36 may be formed from glass, metal, plastic, ceramic, porcelain, or other substrate materials. Pixels 22 may receive data signals over signal paths such as data lines D (sometimes referred to as data signal lines, column lines, etc.) and may receive one or more control signals over control signal paths such as horizontal control lines G (sometimes referred to as gate lines, scan lines, emission lines, row lines, etc.). There may be any suitable number of rows and columns of pixels 22 in display 14 (e.g., tens or more, hundreds or more, or thousands or more).

Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry 30 may be used to control the operation of pixels 22. The display driver circuitry 30 may be formed from integrated circuits, thin-film transistor circuits, or other suitable electronic circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D (e.g., data lines that run down the columns of pixels 22) while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14 (e.g., the gate driver circuitry may be formed on more than one side of the display pixel array).

Gate driver circuitry 34 (sometimes referred to as horizontal line control circuitry or row driver circuitry) may be implemented as part of an integrated circuit and/or may be implemented using thin-film transistor circuitry. Horizontal/row control lines G in display 14 may carry gate line signals (scan line control signals), emission enable control signals, and/or other horizontal control signals for controlling the pixels of each row. There may be any suitable number of horizontal control signals per row of pixels 22 (e.g., one or more row control lines, two or more row control lines, three or more row control lines, four or more row control lines, five or more row control lines, etc.).

Figure 3:
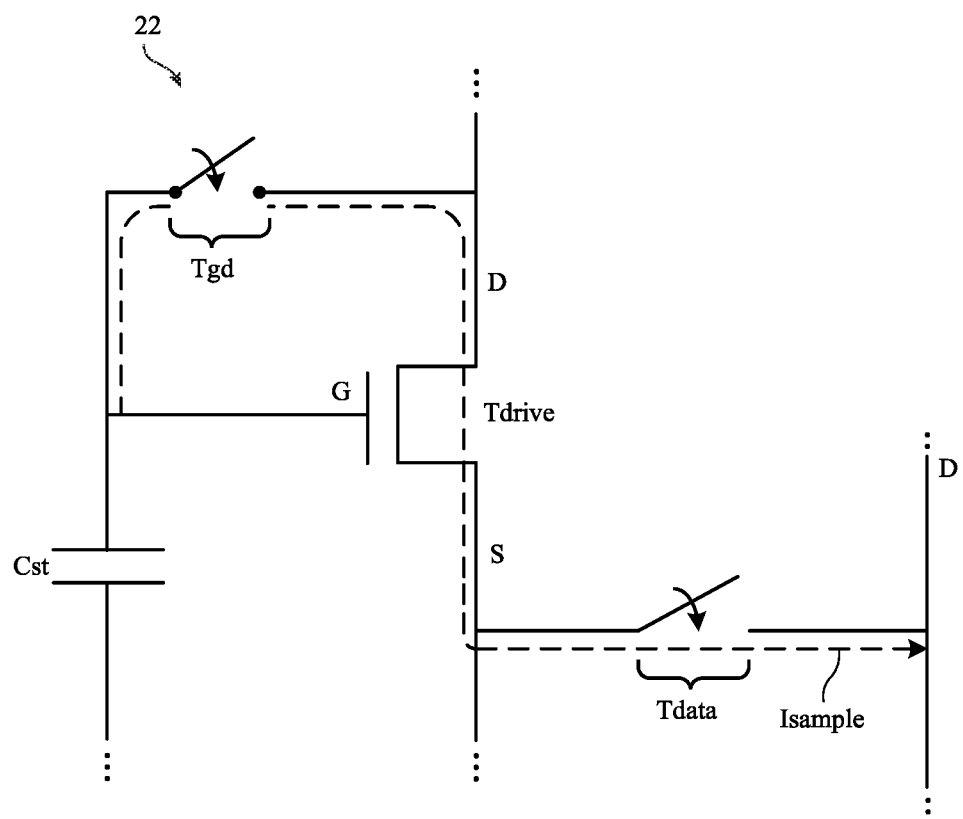
FIG. 3 is a diagram illustrating a sampling current path during a threshold voltage sampling phase in accordance with some embodiments.

FIG. 3 is a diagram showing a portion of pixel 22. As shown in FIG. 3, pixel 22 may include at least a drive transistor such as transistor Tdrive, a storage capacitor such as capacitor Cst, a first switch such as switch Tgd, and a second switch such as switch Tdata. Drive transistor Tdrive is configured to provide a drive current to diode 26 (see FIG. 2) and has a gate (G) terminal, a drain (D) terminal, and a source (S) terminal. The terms "source" and "drain" terminals that are used to describe current-conducting terminals of a transistor are sometimes interchangeable and may be referred to herein as "source-drain" terminals. Storage capacitor Cst may be coupled to the gate terminal of transistor Tdrive. Switch Tgd (e.g., a thin-film transistor such as an n-type semiconducting-oxide transistor, an n-type silicon transistor, or a p-type silicon transistor) is coupled across the drain and gate terminals of transistor Tdrive and is therefore sometimes referred to as a gate-to-drain transistor. Switch Tdata (e.g., a thin-film transistor such as an n-type semiconducting-oxide transistor, an n-type silicon transistor, or a p-type silicon transistor) is coupled between the source terminal of transistor Tdrive and a data line D and is therefore sometimes referred to as a data loading transistor.

In practice, pixel 22 may be subject to process, voltage, and temperature (PVT) variations. Due to such variations, transistor threshold voltages between different display pixels 22 can vary. Variations in the threshold voltage of the drive transistor can cause different display pixels 22 to produce amounts of light that do not match the desired image. In an effort to mitigate threshold voltage variations, display pixel 22 of the type shown in FIG. 3 may be operable to support in-pixel threshold voltage (Vth) compensation. In-pixel threshold voltage compensation operations, sometimes referred to as in-pixel Vth canceling operations, may generally include at least an initialization phase, a data programming and Vth sampling phase, and an emission phase. During the threshold voltage sampling phase, the threshold voltage of transistor Tdrive may be sampled using storage capacitor Cst. Subsequently, during the emission phase, an emission current flowing from transistor Tdrive into the light-emitting diode 26 has a term that cancels out with the sampled Vth. As a result, the emission current will be independent of the drive transistor threshold voltage Vth and will therefore be immune to any Vth variations at the drive transistor. During the data programming and Vth sampling phase, a current can flow through switch Tgd, transistor Tdrive, and switch Tdata, as indicated by sampling current path Isample.

Figure 4A:
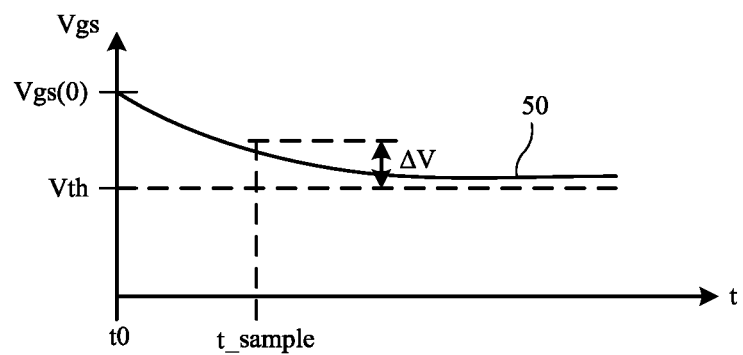
FIG. 4A is a timing diagram showing how the gate-to-source voltage of a display pixel drive transistor can vary in accordance with some embodiments.

FIG. 4A is a timing diagram showing how the gate-to-source voltage Vgs of transistor Tdrive can vary during the data programming and Vth sampling phase. As shown by curve 50 in FIG. 4A, Vgs may have an initial voltage level of Vgs(0) at the beginning of the Vth sampling phase (at time t0) and may gradually discharge toward the threshold voltage level Vth. In practice, the time period for the Vth sampling phase is often constrained by the row access time, which means that Vth has to be sampled within a relatively short amount of time at sampling time t_sample. Terminating the Vth sampling phase at time t_sample may cause pixel 22 to sample a voltage that is $\Delta V$ above Vth, where $\Delta V$ represents a Vth sampling residue amount. It is generally desirable to minimize the Vth sampling residue $\Delta V$.

Figure 4B:
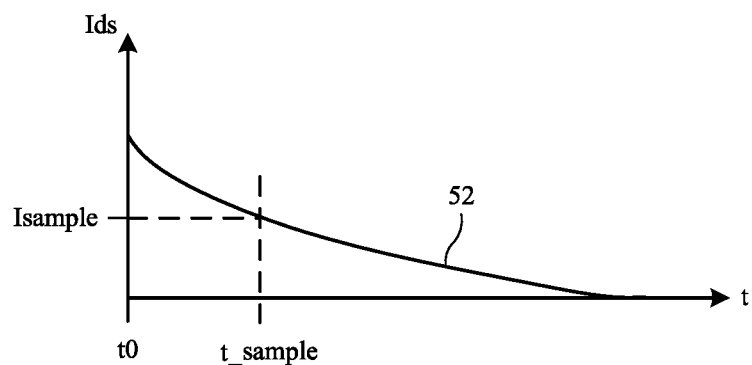
FIG. 4B is a timing diagram showing how a sampling current can vary in accordance with some embodiments.

FIG. 4B is a timing diagram showing how the drive current flowing through transistor Tdrive can vary during the data programming and Vth sampling phase. As shown by curve 52 in FIG. 4B, the drive current Ids may also begin decreasing at the beginning of the Vth sampling phase (at time t0). Terminating the Vth sampling phase at time t_sample will result in a final current level of Isample flowing through the drive transistor.

Figure 5:
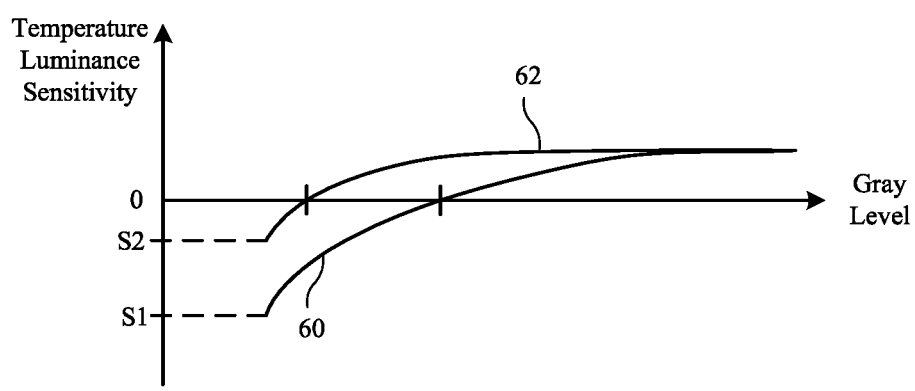
FIG. 5 is a diagram illustrating temperature luminance sensitivity profiles at different sampling current levels in accordance with some embodiments.

The sampling current level Isample may affect a display's sensitivity to temperature. FIG. 5 is a diagram illustrating temperature luminance sensitivity profiles (plotting temperature luminance sensitivity versus gray level) at different sampling current levels. Temperature luminance sensitivity may be proportional to the change in luminance in response to a predetermined change in temperature. It is generally desirable to keep the temperature luminance sensitivity as close to zero as possible to minimize the display's sensitivity to temperature.

As shown in FIG. 5A, curve 60 plots the temperature luminance sensitivity profile for a pixel having a first Isample level, whereas curve 62 plots the temperature luminance sensitivity profile for a pixel having a second Isample level that is lower than the first Isample level. Especially at lower gray levels, curve 62 has a temperature luminance sensitivity level S2 that is closer to zero than curve 60, which has a temperature luminance sensitivity level S1. A larger negative temperature luminance sensitivity induced at lower gray levels can result in display non-uniformity that is visible to the human eye. Thus, operating a pixel at lower Isample levels can help provide a technical improvement to the display by reducing temperature luminance sensitivity. For example, the required voltage swing at the gate of Tdrive to change the absolute value of the drain current through Tdrive from 1 pA to 10 pA at a lower temperature is larger than that at a higher temperature. Referring back to FIG. 4B, reducing Isample requires increasing or pushing out the sampling time t_sample. In conventional display pixel architectures, the Vth sampling duration is, however, limited by the duration of the data programming period (i.e., the data programming period is typically limited to one row time, which is set by the performance requirements of the display).

Figure 6A:
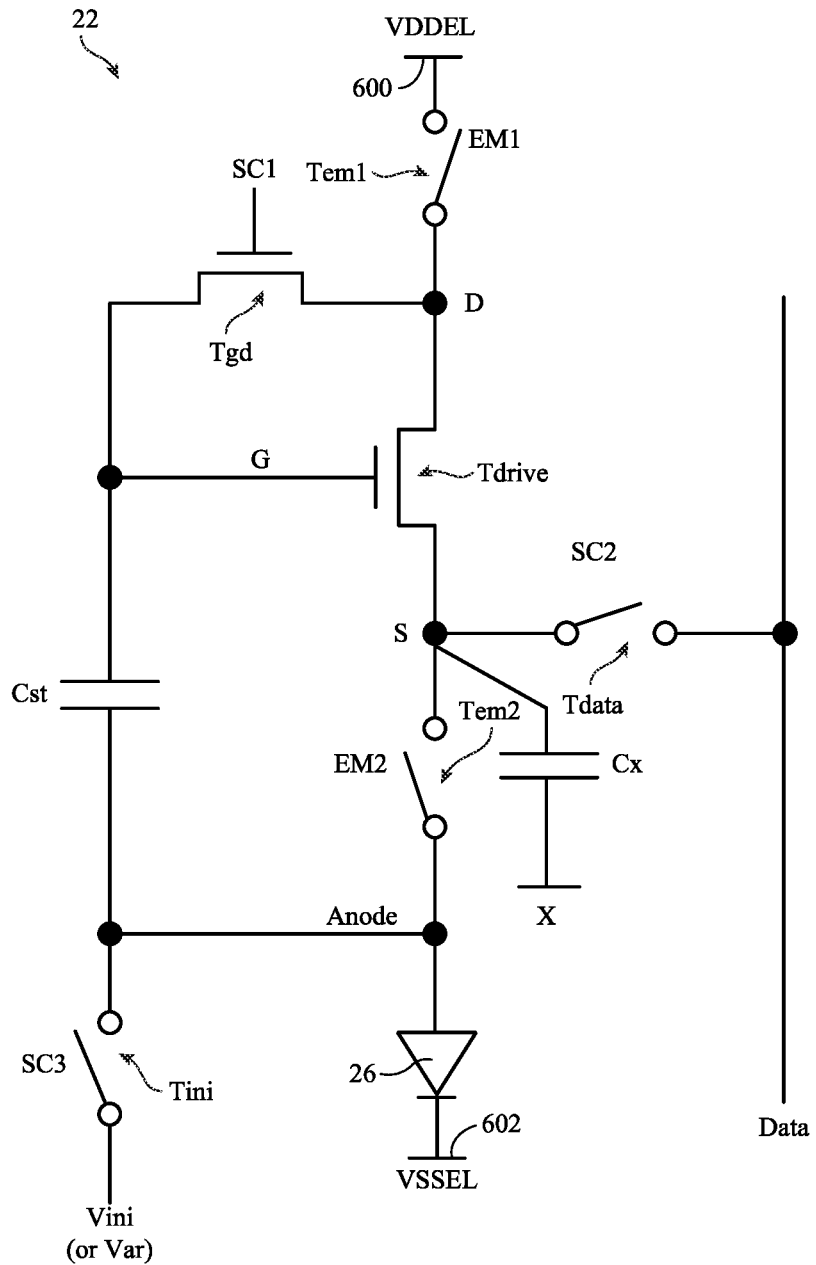
FIG. 6A is a circuit diagram of an illustrative display pixel configured to reduce temperature luminance sensitivity in accordance with some embodiments.

In accordance with an embodiment, FIG. 6A is a circuit diagram of illustrative display pixel 22 configured to reduce temperature luminance sensitivity by extending the threshold voltage sampling period beyond the data programming phase. As shown in FIG. 6A, display pixel 22 may include a light-emitting element such as an organic light-emitting diode 26, a capacitor such as storage capacitor Cst, and thin-film transistors such a drive transistor Tdrive, a gate-to-drain transistor Tgd, a data loading switch (transistor) Tdata, an initialization switch (transistor) Tini, and emission switches (transistors) Tem1 and Tem2. At least some or all of the transistors/switches within pixel 22 such as Tdrive, Tgd, Tdata, Tini, Tem1, and Tem2 are semiconducting oxide transistors. Semiconducting oxide transistors are defined as thin-film transistors having a channel region formed from semiconducting oxide material (e.g., indium gallium zinc oxide or IGZO, indium tin zinc oxide or ITZO, indium gallium tin zinc oxide or IGTZO, indium tin oxide or ITO, or other semiconducting oxide material) and are generally considered n-type (n-channel) transistors.

A semiconducting oxide transistor is notably different than a silicon transistor (i.e., a transistor having a polysilicon channel region deposited using a low temperature process sometimes referred to as LTPS or low-temperature polysilicon). Semiconducting oxide transistors exhibit lower leakage than silicon transistors, so implementing at least some of the transistors within pixel 22 can help reduce flicker (e.g., by preventing current from leaking away from the gate terminal of drive transistor Tdrive).

If desired, at least some of the transistors within pixel 22 may be implemented as silicon transistors such that pixel 22 has a hybrid configuration that includes a combination of semiconducting oxide transistors and silicon transistors (e.g., n-type LTPS transistors or p-type LTPS transistors). In yet other suitable embodiments, pixel 22 may include one or more anode reset transistors configured to reset the anode (A) terminal of diode 26. As another example, display pixel 22 may further include one or more initialization transistors for apply an initialization or reference voltage to an internal node within pixel 22. As another example, display pixel 22 may further include additional switching transistors (e.g., one or more additional semiconducting oxide transistors or silicon transistors) for applying one or more bias voltages for improving the performance or operation of pixel 22.

Drive transistor Tdrive has a gate terminal G, a drain terminal D (sometimes referred to as a first source-drain terminal), and a source terminal S (sometimes referred to as a second source-drain terminal). Drive transistor Tdrive, emission control transistors Tem1 and Tem2, and light-emitting diode 26 are coupled in series between positive power supply line 600 and ground power supply line 602. Emission transistor Tem1 has a gate terminal configured to receive a first emission control signal EM1, whereas emission transistor Tem2 has a gate terminal configured to receive a second emission control signal EM2. This example in which transistors Tem1 and Tem2 receive two different emission signals is merely illustrative. As another example, transistors Tem1 and Tem2 can receive the same emission control signal.

A positive power supply voltage VDDEL may be supplied to positive power supply terminal 600, whereas a ground power supply voltage VSSEL may be supplied to ground power supply terminal 602. Positive power supply voltage VDD may be 3 V, 4 V, 5 V, 6 V, 7 V, 2 to 8 V, greater than 6 V, greater than 8 V, greater than 10 V, greater than 12 V, 6-12 V, 12-20 V, or any suitable positive power supply voltage level. Ground power supply voltage VSSEL may be 0 V, −1 V, −2 V, −3 V, −4 V, −5 V, −6V, −7 V, less than 2 V, less than 1 V, less than 0 V, or any suitable ground or negative power supply voltage level. During emission operations, signals EM1 and EM2 are asserted to turn on transistors Tem1 and Tem2, which allows current to flow from drive transistor Tdrive to diode 26. The degree to which drive transistor Tdrive is turned on controls the amount of current flowing from terminal 600 to terminal 602 through diode 26 and therefore the amount of emitted light from display pixel 22.

In the example of FIG. 6A, storage capacitor Cst may be coupled between the gate terminal of drive transistor Tdrive and the anode (A) terminal of diode 26. Transistor Tgd may have a first source-drain terminal connected to the gate terminal of transistor Tdrive, a second source-drain terminal connected to the drain terminal of drive transistor Tdrive, and a gate terminal configured to receive a first scan control signal SC1. Data loading transistor Tdata may have a first source-drain terminal connected to the source terminal of transistor Tdrive, a second source-drain terminal connected to the data line, and a gate terminal configured to receive a second scan control signal SC2. Scan control signals SC1, SC2, and SC3 may be provided over row control lines (see lines G in FIG. 2). Transistor Tini may have a first source-drain terminal connected to the anode terminal (sometimes referred to as the anode electrode) of diode 26, a second source-drain terminal configured to receive an initialization (reference) voltage Vini via an initialization voltage line, and a gate terminal configured to receive a third scan control signal SC3. Initialization voltage Vini can also sometimes be referred to as an anode reset voltage Var. Diode 26 has a cathode terminal (sometimes referred to as the cathode electrode) coupled to VSSEL ground power supply line 602 (sometimes referred to as the common power supply line).

In particular, display pixel 22 may further include a capacitor such as capacitor Cx having a first terminal coupled to the source terminal of transistor Tdrive and a second terminal configured to receive a control signal X.

Figure 6B:
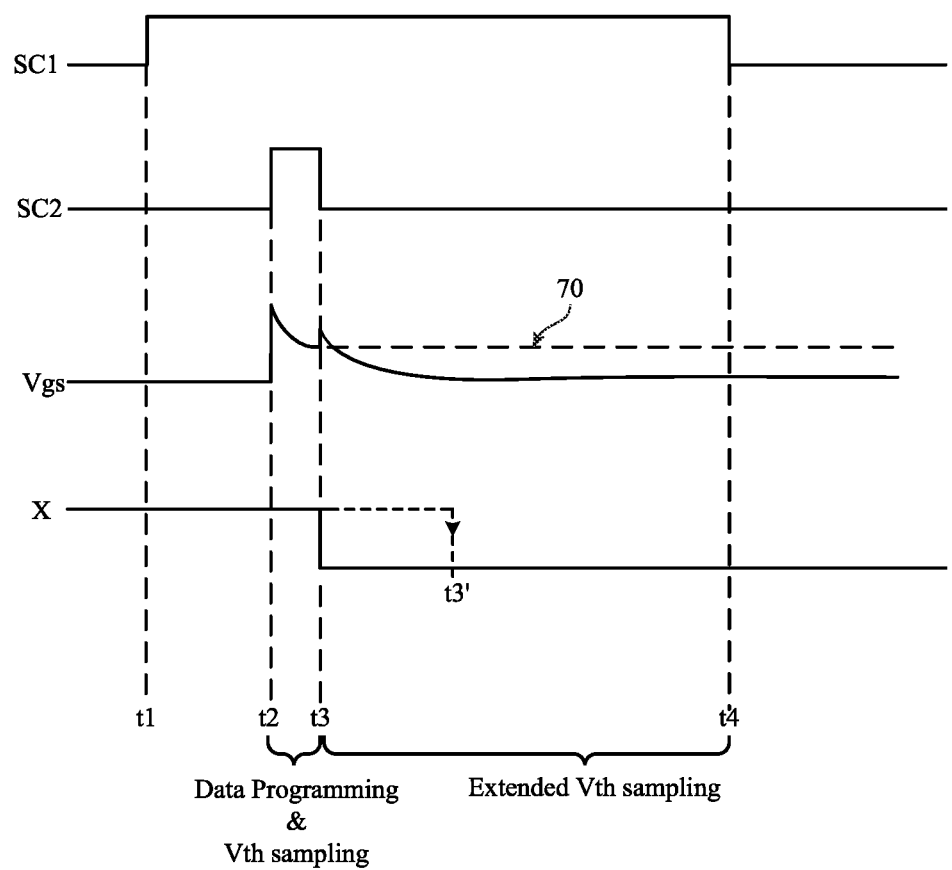
FIG. 6B is a timing diagram illustrating a data programming and threshold voltage sampling phase and an extended threshold voltage sampling phase in accordance with some embodiments.

Control signal X may be generated by a gate driver circuit and may therefore sometimes be referred to as a gate driver signal. Control signal X may be adjusted in a way that extends the threshold voltage sampling time beyond the data programming phase. FIG. 6B is a timing diagram illustrating the operation of display pixel 22 of the type shown in FIG. 6A. At time t1, scan signal SC1 may be asserted (driven high) to turn on (activate) transistor Tgd. At time t2, scan signal SC2 may be pulsed high to temporarily activate data loading transistor Tdata. While scan signal SC2 is high from time t2 to t3, transistor Tdata is configured to load in a data signal from the data line onto source terminal S of the drive transistor. This time period during which both transistors Tdata and Tgd are activated is sometimes referred to as the data programming (loading) and Vth sampling phase. The gate-to-source voltage of the drive transistor Vgs will initially jump up at time t2 and will slowly discharge during the data programming and Vth sampling phase.

At time t3, data loading transistor Tdata is turned off (deactivated), which terminates the data programming phase. If no further action is taken, Vgs will hold its current value (see voltage level 70) since the charge on capacitor Cst has nowhere is discharge and the Vth sampling phase will also terminate. At time t3, however, signal X may toggle from a first voltage level to a second voltage level that is less than the first voltage level. Lowering signal X in this way will initially cause Vgs to rise at time t3, but then current will start flowing from capacitor Cst to capacitor Cx through the drive transistor. This current path from Cst to Cx will cause Vgs to continue to decrease as long as scan signal SC1 is asserted. A Vgs that continues to decrease below voltage level 70 even after transistor Tdata has been turned off effectively extends the threshold voltage sampling time since the voltage held on capacitor Cst will continue to update or discharge itself to a value that is closer to the true Vth level, thereby minimizing the Vth sampling residual value ΔV (see FIG. 4A).

The time period from time t3 (when Tdata is deactivated) to time t4 (when Tgd is deactivated) during which Vth sampling can continue to take place even after the data programming phase has terminated may therefore sometimes be referred to as an extended threshold voltage (Vth) sampling phase. Capacitor Cx that is used to extend the Vth sampling period may therefore sometimes be referred to as a threshold voltage sampling extension capacitor. As described in connection with FIGS. 4B and 5, a longer sampling time can result in lower Isampling levels, which ultimately reduces a display's temperature luminance sensitivity. The example of FIG. 6B in which the lowering of signal X is synchronized with the deassertion of scan signal SC2 is merely illustrative. If desired, the signal X adjustment may be delayed to time t3' (see dotted waveform), which can occur at any time after time t3 (i.e., any time after Tdata is deactivated) and before time t4 (i.e., any time before Tgd is deactivated). Configured and operated in this way, the display will be less sensitive to temperature variations and will therefore exhibit improved thermal uniformity.

In general, the scan control signals are routed using separate scan lines. For example, scan signal SC1 may be generated using a first gate driver circuit and routed to pixel 22 via a first scan (row) line, scan signal SC2 may be generated using a second gate driver circuit and routed to pixel 22 via a second scan (row) line, and scan signal SC3 may be generated using a third gate driver circuit and routed to pixel 22 via a third scan (row) line. Scan control signal SC2 and capacitor biasing signal X may or may not be generated using the same gate driver within gate driver circuitry 34 (FIG. 2).

Figure 7A:
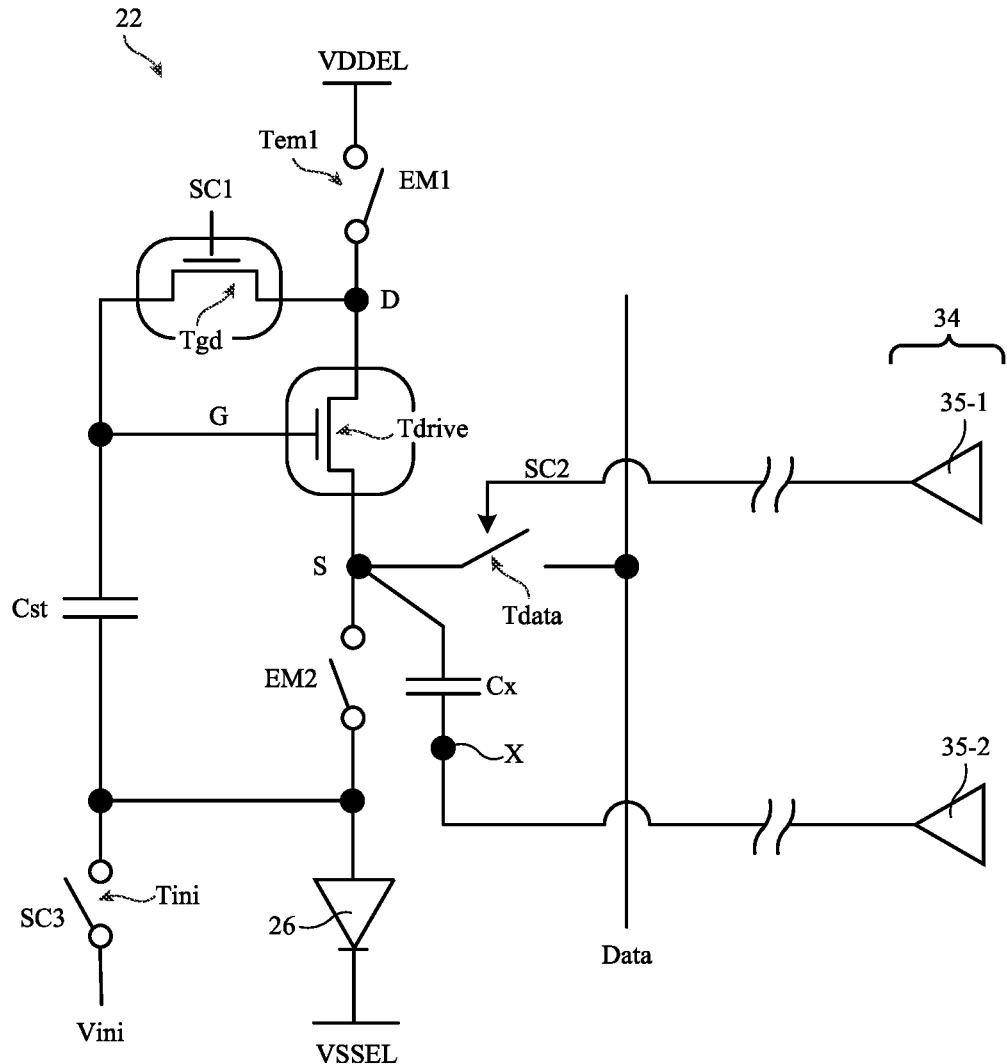
FIG. 7A is a circuit diagram of an illustrative display pixel having a data loading transistor and a threshold voltage sampling extension capacitor driven using separate peripheral gate drivers in accordance with some embodiments.

FIG. 7A illustrates a first embodiment in which scan signal SC2 is generated using a first gate driver 35-1 within gate driver circuitry 34, whereas capacitor biasing signal X is generated using a second gate driver 35-2 within gate driver circuitry 34. In other words, signals SC2 and X are generated using separate dedicated gate drivers in the periphery of the display pixel array and are fed to transistor Tdata and capacitor Cx via respective row lines. In the example of FIG. 7A, transistors Tdrive and Tgd may be implemented as semiconducting oxide transistors. The remaining transistors such as transistors Tdata, Tini, Tem1, Tem2, and/or other switches within pixel 22 can each be implemented as a semiconducting oxide transistor or a silicon transistor (e.g., an n-type LTPS transistor or a p-type LTPS transistor).

Figure 7B:
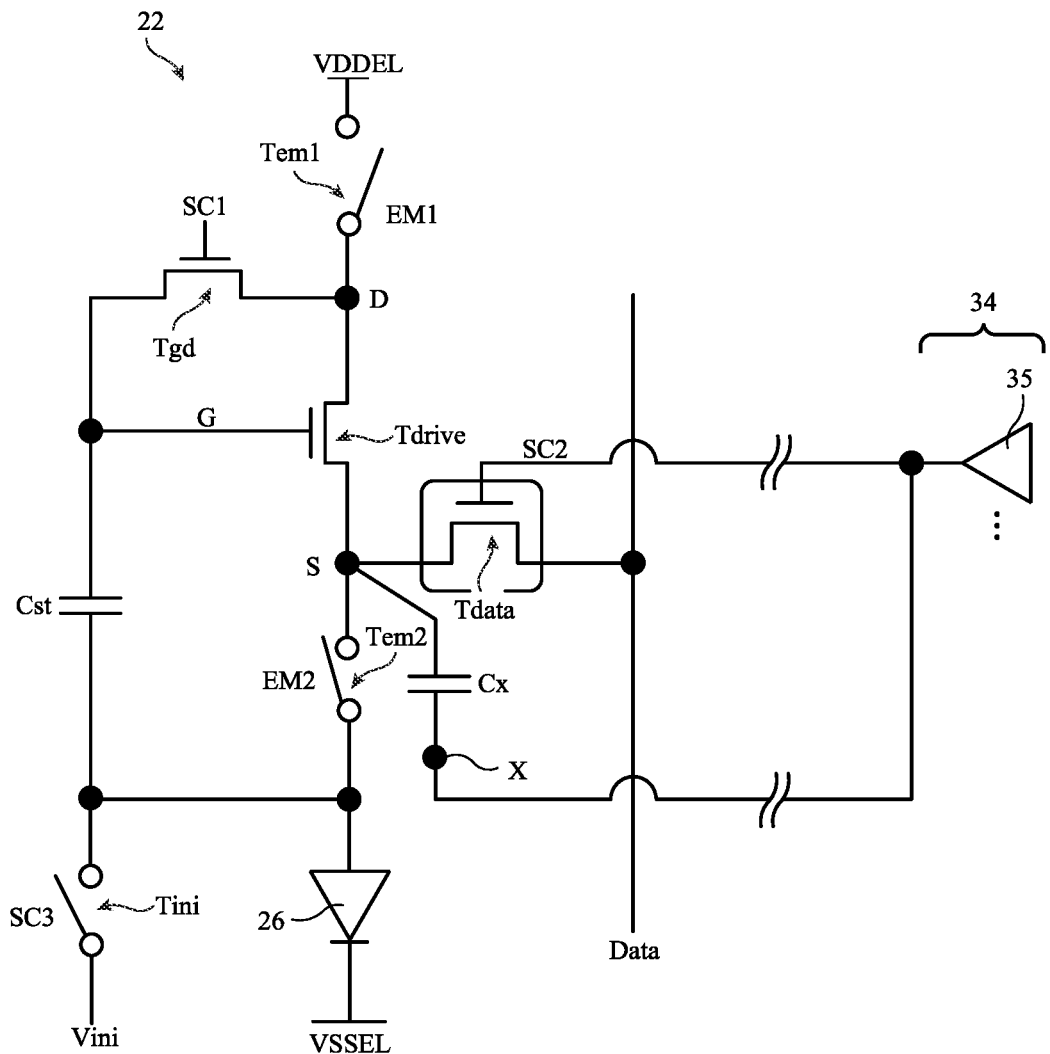
FIG. 7B is a circuit diagram of an illustrative display pixel having a data loading transistor and a threshold voltage sampling extension capacitor driven using a shared peripheral gate driver in accordance with some embodiments.

FIG. 7B illustrates another embodiment in which scan signal SC2 and capacitor biasing signal X are generated using the same gate driver 35 within gate driver circuitry 34. As shown in FIG. 7B, the output of gate driver 35 may be routed to the gate of transistor Tdata via a first row line and may be routed to capacitor X via a second row line different than the first row line. In this arrangement, signal X will have the same waveform as signal SC2 (e.g., signal X will be deasserted at the same time as SC2). In the example of FIG. 7B, transistor Tdata may also be implemented as a semiconducting oxide transistor. The remaining transistors such as transistors Tini, Tem1, Tem2, and/or other switches within pixel 22 can each be implemented as a semiconducting oxide transistor or a silicon transistor (e.g., an n-type LTPS transistor or a p-type LTPS transistor). In the example of FIG. 7B where scan signal SC1 and SC2 have the same polarity (i.e., both SC1 and SC2 are driven high to turn on transistors Tgd and Tdata, respectively), signal X can be driven using the same gate driver that generates scan signal SC2.

Figure 7C:
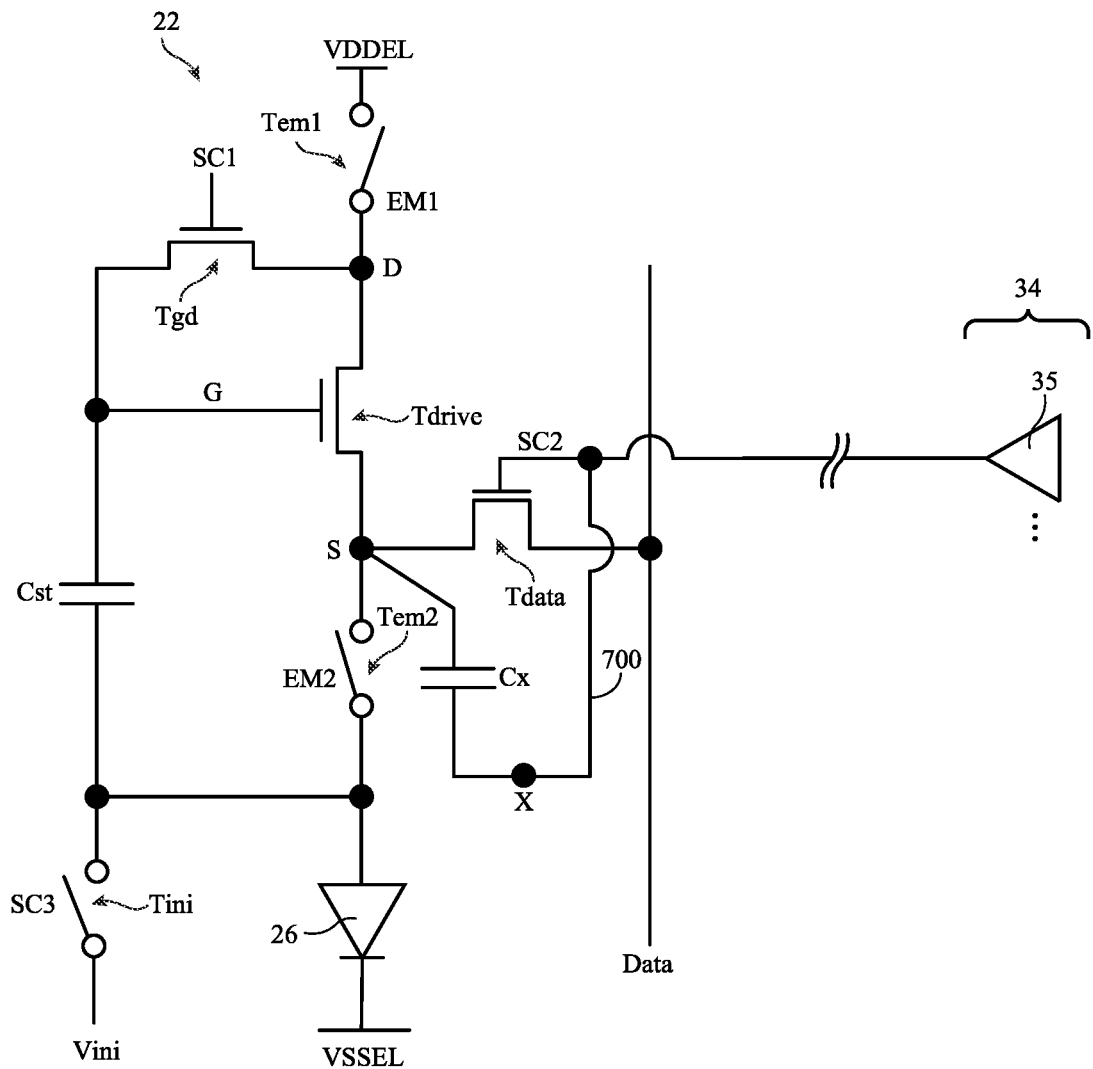
FIG. 7C is a circuit diagram of an illustrative display pixel having a data loading transistor and a threshold voltage sampling extension capacitor connected within the pixel and driven using a peripheral gate driver in accordance with some embodiments.

FIG. 7C illustrates yet another embodiment in which scan signal SC2 and capacitor biasing signal X are generated using the same gate driver 35 within gate driver circuitry 34. As shown in FIG. 7C, the gate terminal of transistor Tdata is directly coupled to capacitor Cx via a wire 700 within pixel 22 (e.g., the gate of Tdata and the bottom terminal of Cx are shorted internally within pixel 22). Connected in this way, the output of gate driver 35 is routed to the gate of transistor Tdata via only one row line (instead of using two different row lines as shown in the example of FIG. 7B). In this arrangement, signal X will have the same waveform as signal SC2 (e.g., signal X will be deasserted at the same time as SC2). In the example of FIG. 7C where scan signal SC1 and SC2 have the same polarity (i.e., both SC1 and SC2 are driven high to turn on transistors Tgd and Tdata, respectively), signal X can be driven using the same gate driver that generates scan signal SC2.

Figure 8A:
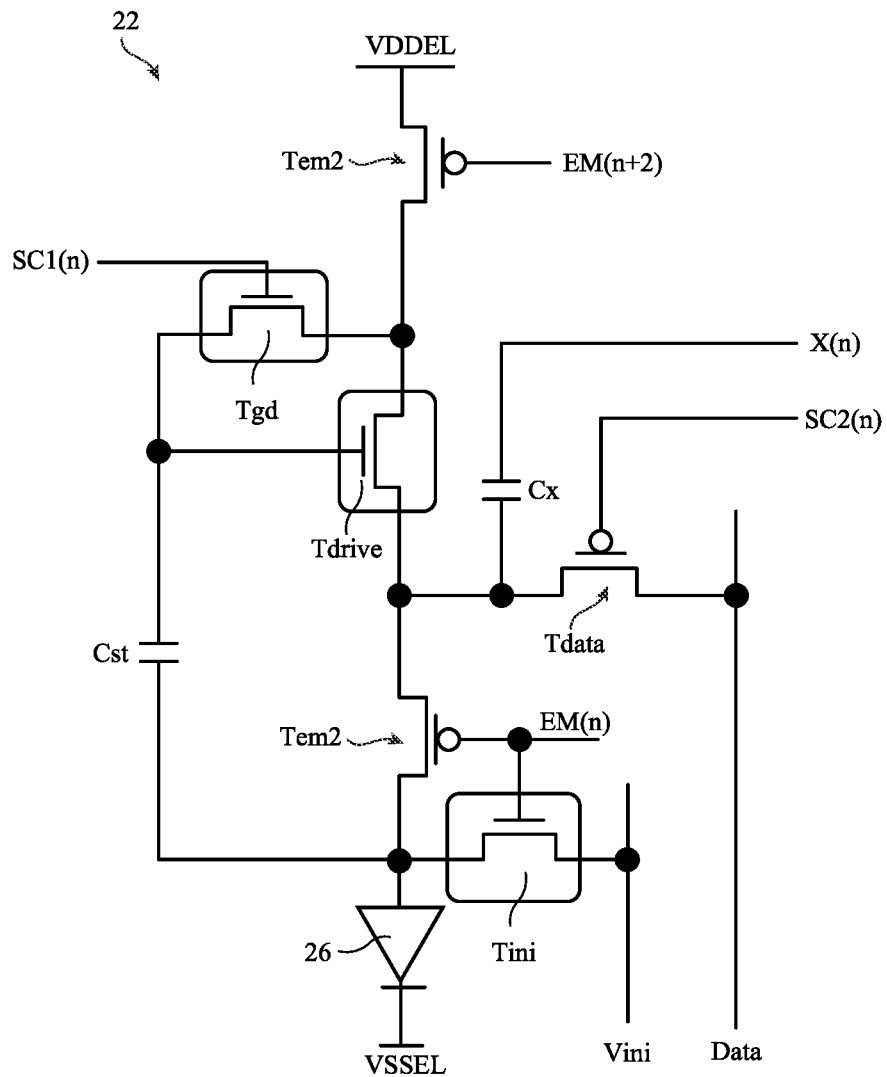
FIG. 8A is a circuit diagram of an illustrative display pixel having at least three semiconducting oxide transistors in accordance with some embodiments.

FIG. 8A illustrates another example in which pixel 22 includes three semiconducting oxide transistors. As shown in FIG. 8A, transistors Tdrive, Tgd, and Tini may be implemented as semiconducting oxide transistors, whereas transistors Tdata, Tem1, and Tem2 are implemented as p-type silicon transistors. Here, scan signal SC2(n) and capacitor biasing signal X(n) are provided via separate row lines similar to the example of FIG. 7A where signals SC2 and X are generated using separate peripheral gate drivers. The notation "(n)" refers to the row that pixel 22 belongs too. Thus, transistor Tem2 will receive an emission signal EM(n) from an emission driver in the same row as pixel 22, whereas transistor Tem1 will receive an emission signal EM(n+2) that is routed from another emission driver configured to drive pixels two rows below pixel 22. Note that in the example of FIG. 8A, the initialization transistor Tini is also controlled by emission signal EM(n) (e.g., the gate terminals of transistors Tini and Tem2 may be shorted together).

Figure 8B:
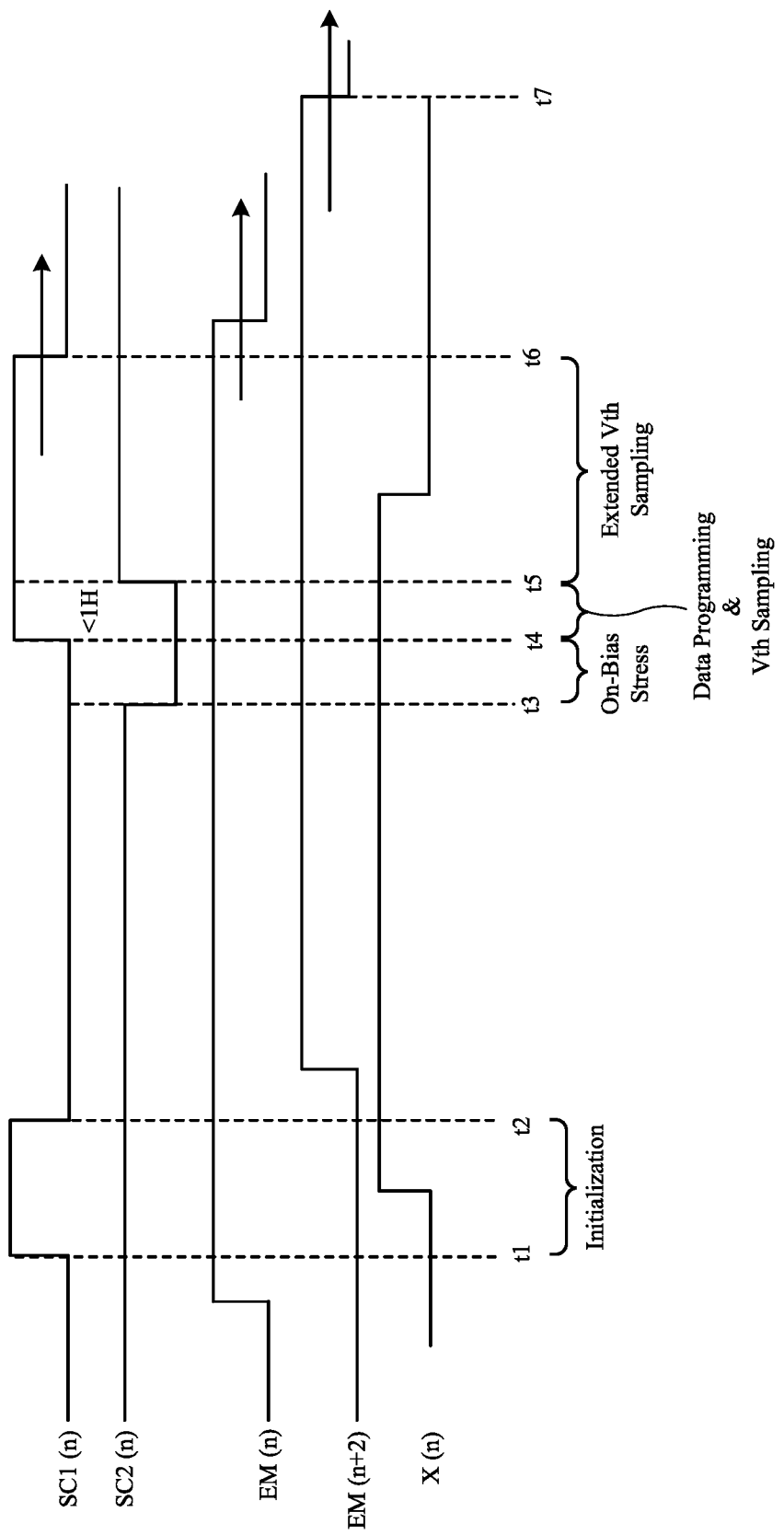
FIG. 8B is a timing diagram showing illustrative waveforms involved in operating the display pixel of FIG. 8A in accordance with some embodiments.

FIG. 8B is a timing diagram showing illustrative waveforms involved in operating the display pixel of FIG. 8A. Prior to time t1 when both EM(n) and EM(n+2) are asserted (e.g., driven high for the p-channel emission transistors), pixel 22 may operate in the emission phase. Signal EM(n+2) may be a delayed version of signal EM(n). When signal EM(n) is deasserted (e.g., driven high), the emission phase terminates.

At time t1 (at the beginning of an initialization phase), control signal SC1(n) is pulsed high to activate transistor Tgd. Since signal EM(n+2) is still low at this time, transistor Tem1 is activated. Since both transistors Tem1 and Tgd are on, the gate and drain terminals of the drive transistor will be pulled up to positive power supply voltage VDDEL. Since signal EM(n) is high, transistor Tini will drive the anode electrode of diode 26 to the Vini voltage level. This period can sometimes be referred to as an "anode reset" phase. Storage capacitor Cst is coupled across the gate terminal of Tdrive and the anode terminal. During the initialization phase, the voltage across capacitor Cst is therefore reset to a predetermined voltage difference (VDDEL-Vini). Signal SC1(n) is deasserted at time t2, which marks the end of the initialization and anode reset phase. Signal EM(n+2) is subsequently driven high some time after t2 and before t3, which turns off transistor Tem1.

At time t3, scan signal SC(2) is pulsed low to temporarily activate the data loading transistor Tdata. Turning on transistor Tdata will load a data voltage Vdata onto the source terminal of the drive transistor such that the voltage Vs at the source terminal of Tdrive is set to Vdata (i.e., Vs=Vdata). Scan signal SC1(n) is low during this time, which keeps transistor Tgd deactivated. As a result, the voltage the gate of the drive transistor cannot change. In certain situations, threshold voltage Vth can shift, such as when display 14 is transitioning from a black image to a white image or when transitioning from one gray level to another. This shifting in Vth (sometimes referred to herein as thin-film transistor "hysteresis") can cause a reduction in luminance, which is otherwise known as "first frame dimming."

For example, the saturation current Ids waveform as a function of Vgs of the drive transistor for a black frame might be slightly offset from the target Ids waveform as a function of Vgs of the drive transistor for a white frame. Without performing an on-bias stress operation, the sampled Vth will correspond to the black frame and will therefore deviate from the target Ids waveform by quite a large margin. By performing on-bias stress, the sampled Vth will correspond to Vdata and will therefore be much closer to the target Ids curve. Performing the on-bias stress phase to bias the Vgs of the drive transistor with Vdata before sampling Vth can therefore help mitigate hysteresis and improve first frame response. An "on-bias stress phase" may therefore be defined as an operation that applies a suitable bias voltage directly to the drive transistor during non-emission phases (e.g., such as by turning on the data loading transistor Tdata). The on-bias stress phase terminals at time t4 when scan signal SC1(n) is driven high.

At time t4, scan signal SC1(n) is driven high to reactivate gate-to-drain transistor Tgd. From time t4 to t5, transistors Tgd and Tdata are both activated. Activating transistor Tdata will load data signal D(n) into pixel 22 (e.g., by driving the data signal onto the source terminal of transistor Tdrive). Since signal SC1(n) is high, the voltage at the gate and drain terminals of transistor Tdrive will shift up or down depending on the value of D(n) while retaining a Vth difference across the gate and source terminals since the voltage has nowhere to discharge. The time period from time t4 to t5 is therefore sometimes referred to as a data programming and Vth sampling phase. The data programming period may be equal to or less than one row time.

At time t5, scan signal SC2(n) is driven high, which deactivates transistor Tdata and terminates the data programming operation. Some time between t5 and t6, signal X(n) is driven low. As described above in connection with FIG. 6B, driving signal X(n) low after the data programming phase can help extend the Vth sampling time by discharging current from capacitor Cst to capacitor Cx via transistor Tgd. The time period between time t5 (when the data programming phase terminates) and time t6 (when transistor Tgd is deactivated) may therefore sometimes be referred to as the extended Vth sampling phase. The falling edge of scan signal SC1(n) can be adjusted to tune the duration of the extended Vth sampling period. At time t7, emission control signals EM(n) and EM(n+2) are both asserted (driven low) to resume the emission period.

Figure 9A:
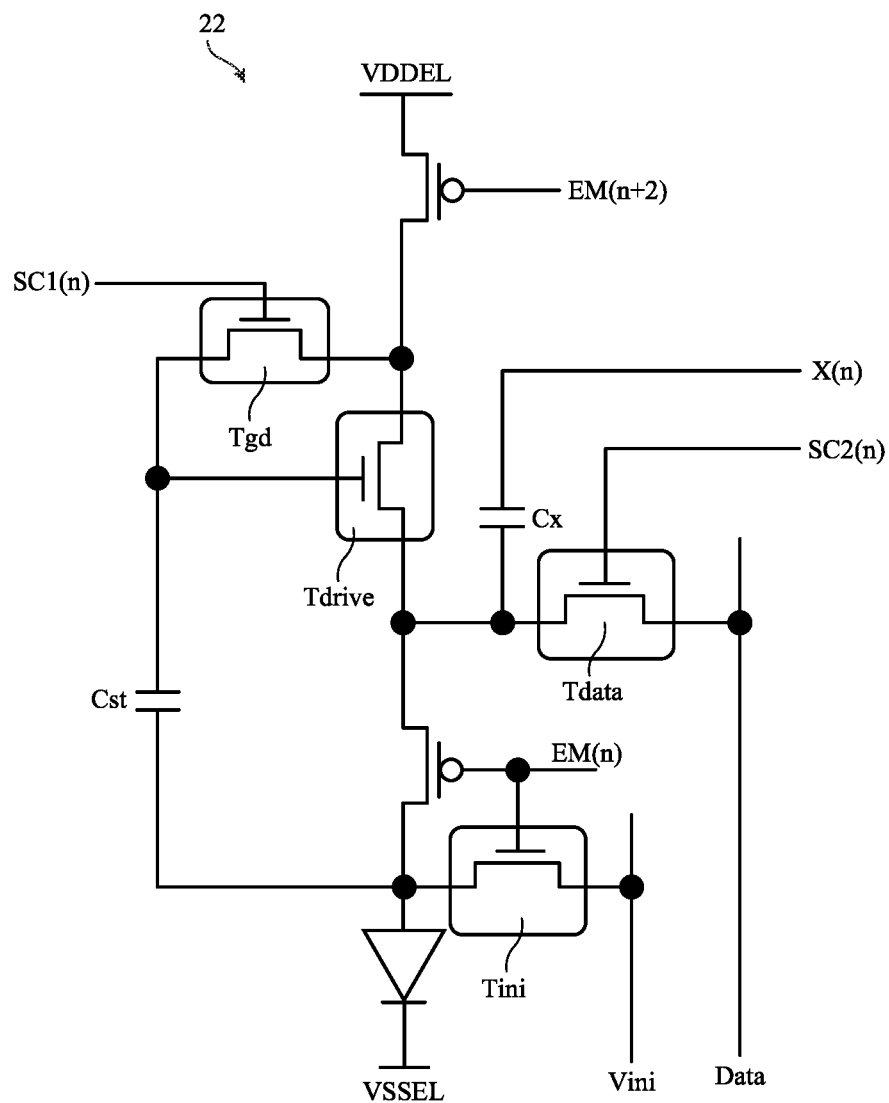
FIG. 9A is a circuit diagram of an illustrative display pixel having at least four semiconducting oxide transistors in accordance with some embodiments.
Figure 9B:
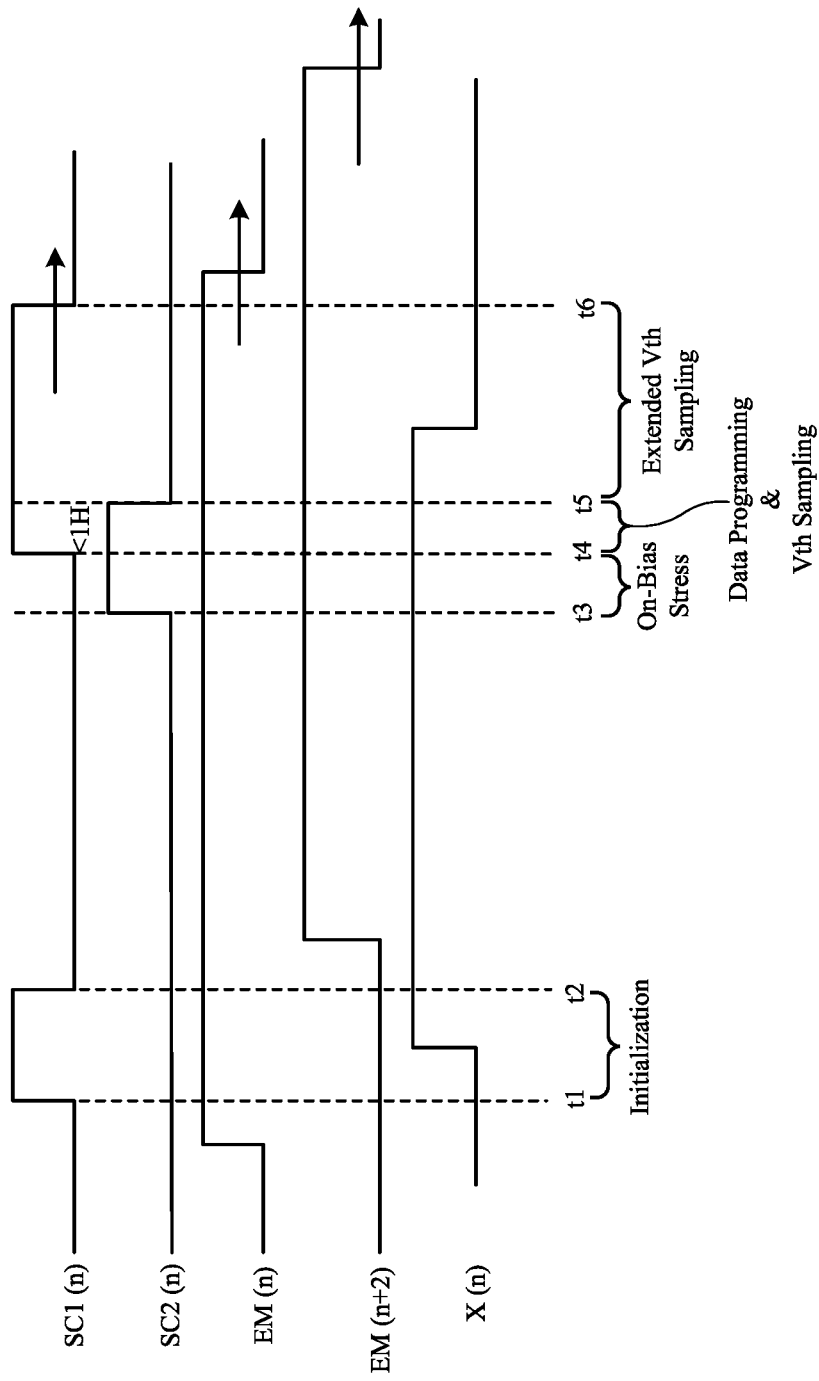
FIG. 9B is a timing diagram showing illustrative waveforms involved in operating the display pixel of FIG. 9A in accordance with some embodiments.

The example of FIG. 8A in which the data loading transistor Tdata is implemented as a p-channel silicon transistor is merely illustrative. FIG. 9A illustrates another example where the data loading transistor Tdata is implemented as a semiconducting oxide transistor. As shown in FIG. 9A, pixel 22 now includes at least four semiconducting oxide transistors (e.g., transistors Tdrive, Tgd, Tini, and Tdata may all be semiconducting oxide switches). The remainder of pixel 22 is similar to FIG. 8A and need not be reiterated in detail to avoid obscuring the present embodiment. FIG. 9B is a timing diagram showing illustrative waveforms involved in operating the display pixel of FIG. 9A. The operation illustrated in FIG. 9B is similar to that already shown in FIG. 8B, except scan signal SC2(n) of FIG. 9B is inverted with respect to scan signal SC2(n) of FIG. 8B to control the n-channel semiconducting oxide transistor Tdata.

Figure 10A:
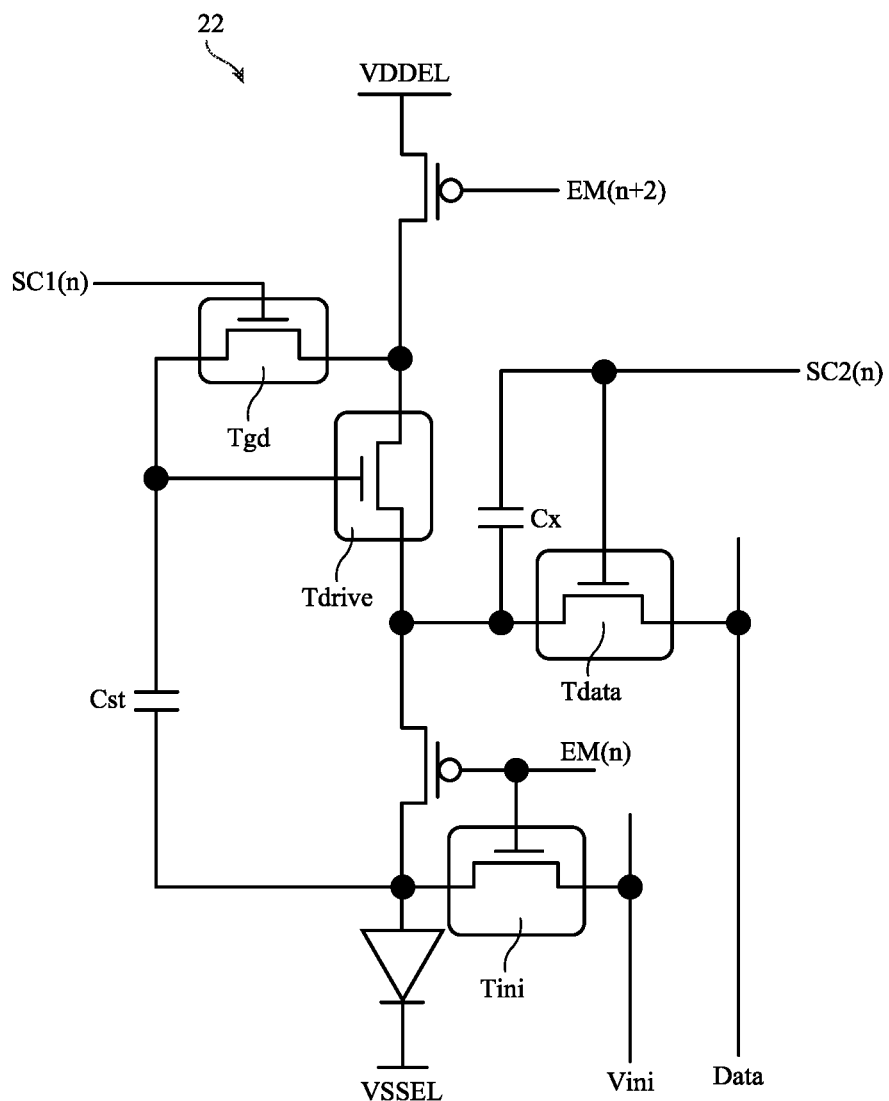
FIG. 10A is a circuit diagram of an illustrative display pixel having a data loading transistor and a threshold voltage sampling extension capacitor shorted together in accordance with some embodiments.

The example of FIG. 9A in which SC2(n) and X(n) are connected to different row lines is merely illustrative. FIG. 10A shows another example where capacitor Cx is directly connected to the gate of transistor Tdata, similar to the configuration of FIG. 7C. The remainder of pixel 22 is similar to FIG. 9A and need not be reiterated in detail to avoid obscuring the present embodiment. The timing diagram for operating pixel 22 of FIG. 10A is similar to the timing diagram of FIG. 9B without the X(n) waveform. Since capacitor Cx is shorted to the gate of Tdata, the X(n) waveform will be identical to that of scan signal SC2(n).

Figure 10B:
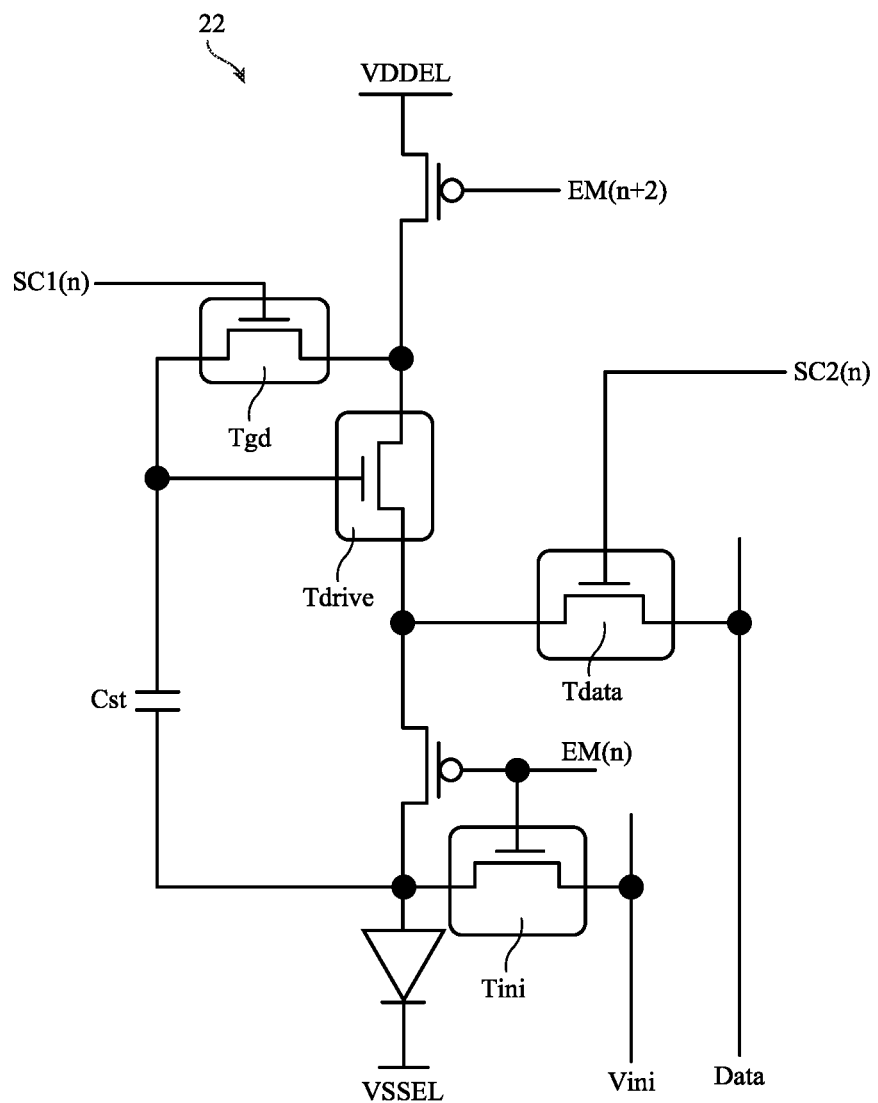
FIG. 10B is a circuit diagram of an illustrative display pixel operable to perform an extended threshold voltage sampling phase in accordance with some embodiments.

The example of FIG. 10A in which capacitor Cx is coupled between the gate and source terminals of transistor Tdata is merely illustrative. FIG. 10B shows another implementation where capacitor Cx can optionally be left out from pixel 22 of FIG. 10A if the parasitic gate-to-source capacitance of semiconducting oxide transistor Tdata is large enough to provide sufficient capacitive coupling from the SC2(n) signal to the source terminal of the drive transistor. The size of transistor Tdata can be increased relative to the other transistors in pixel 22 to obviate the need to form capacitor Cx. For example, transistor Tdata can be larger than each of the emission transistors, the initialization transistor, Tdrive, Tgd, and/or other switching transistors in pixel 22. The timing diagram for operating pixel 22 of FIG. 10B is similar to the timing diagram of FIG. 9B but without the X(n) waveform.

Figure 11A:
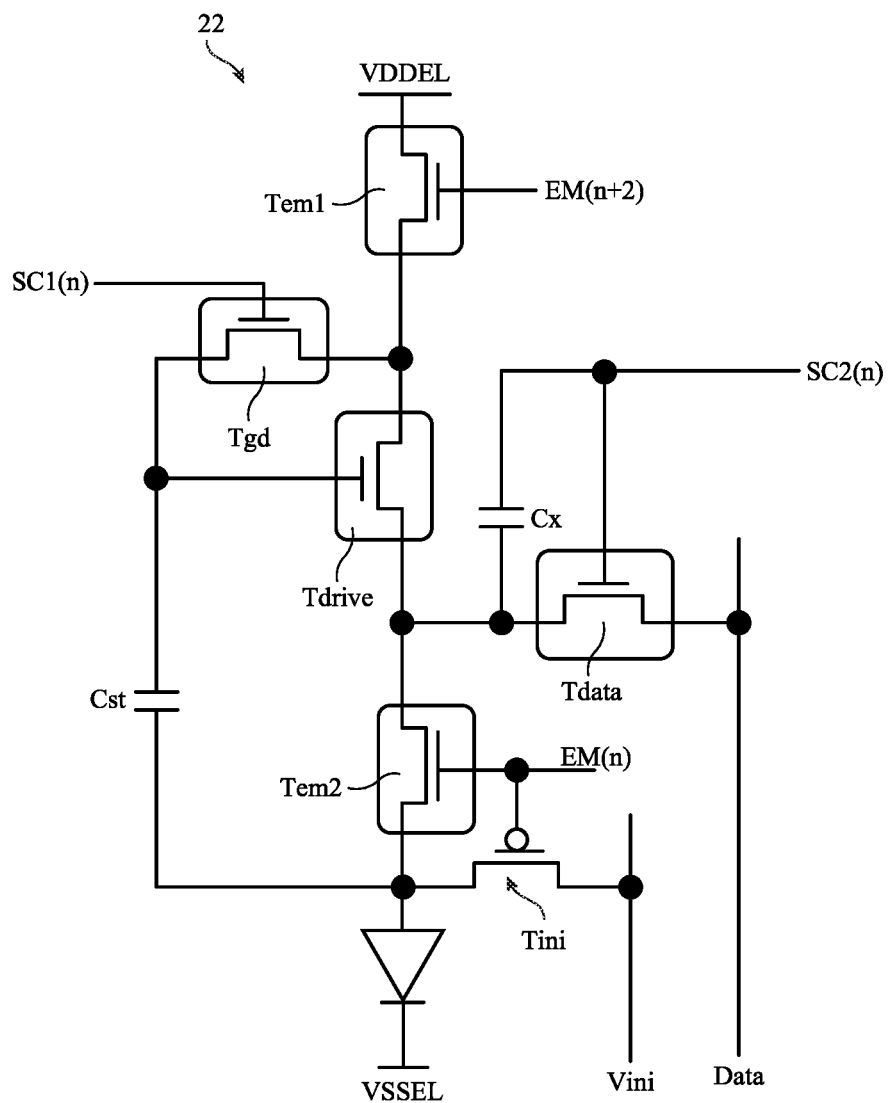
FIG. 11A is a circuit diagram of an illustrative display pixel having at least five semiconducting oxide transistors in accordance with some embodiments.

FIG. 11A illustrates another example in which pixel 22 includes five semiconducting oxide transistors. As shown in FIG. 11A, transistors Tdrive, Tgd, Tdata, Tem1, and Tem2 may be implemented as semiconducting oxide transistors, whereas transistor Tini is implemented as a p-type silicon transistor. Here, capacitor Cx is shorted to the gate of transistor Tdata within pixel 22 similar to the example of FIG. 7C where signals SC2 and X are generated using the same peripheral gate driver.

Figure 11B:
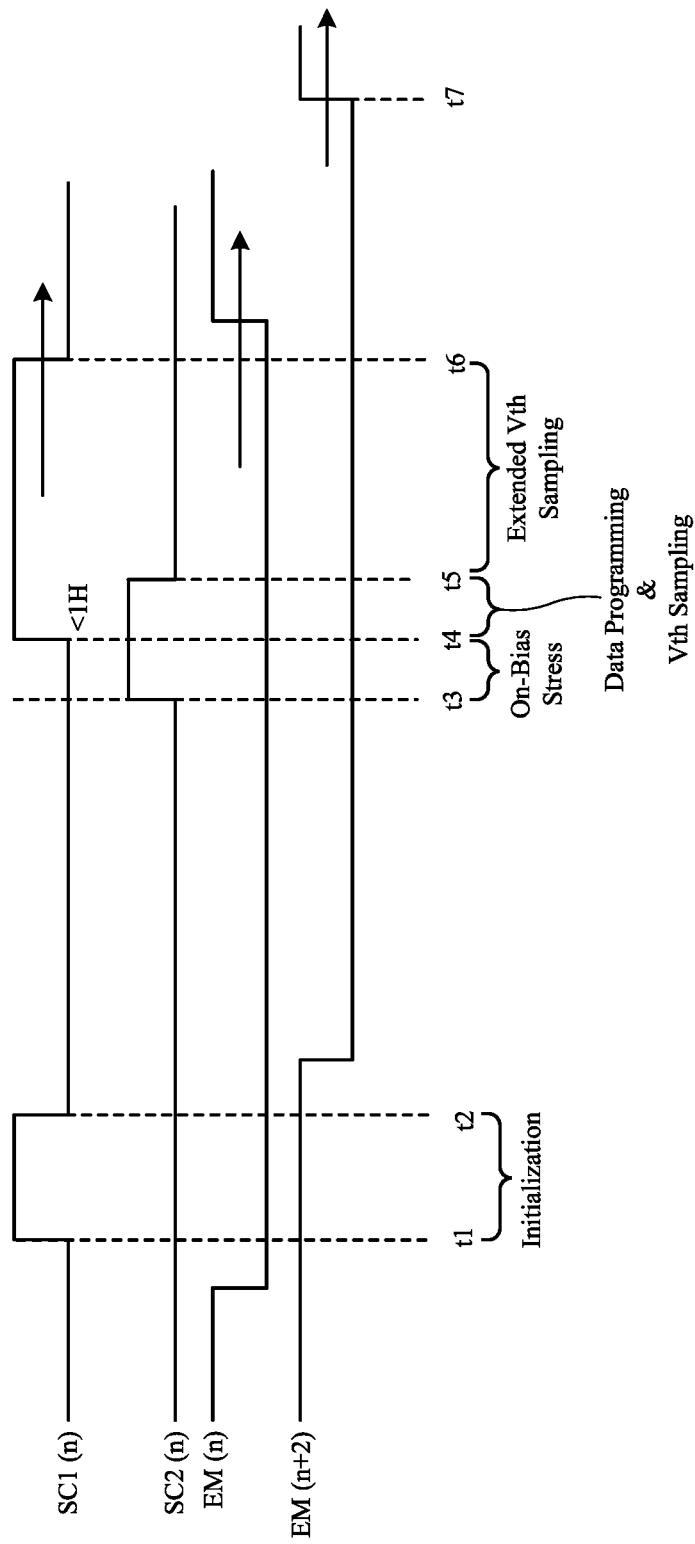
FIG. 11B is a timing diagram showing illustrative waveforms involved in operating the display pixel of FIG. 11A in accordance with some embodiments.

FIG. 11B is a timing diagram showing illustrative waveforms involved in operating the display pixel of FIG. 11A. Prior to time t1 when both EM(n) and EM(n+2) are asserted (e.g., driven high for the n-channel emission transistors), pixel 22 may operate in the emission phase. Signal EM(n+2) may be a delayed version of signal EM(n). When signal EM(n) is deasserted (e.g., driven low), the emission phase terminates.

At time t1 (at the beginning of an initialization phase), control signal SC1(n) is pulsed high to activate transistor Tgd. Since signal EM(n+2) is still high at this time, transistor Tem1 is activated. Since both transistors Tem1 and Tgd are on, the gate and drain terminals of the drive transistor will be pulled up to positive power supply voltage VDDEL. Since signal EM(n) is low, transistor Tini will drive the anode terminal of diode 26 to the Vini voltage level. This period can sometimes be referred to as the anode reset phase. Storage capacitor Cst is coupled across the gate terminal of Tdrive and the anode terminal. During the initialization phase, the voltage across capacitor Cst is therefore reset to a predetermined voltage difference (VDDEL–Vini). Signal SC1(n) is deasserted at time t2, which marks the end of the initialization and anode reset phase. Signal EM(n+2) is subsequently driven low some time after t2 and before t3, which turns off transistor Tem1.

At time t3, scan signal SC(2) is pulsed low to temporarily activate the data loading transistor Tdata during the on-bias stress phase. Turning on transistor Tdata will load a data voltage Vdata onto the source terminal of the drive transistor such that the voltage Vs at the source terminal of Tdrive is set to Vdata (i.e., Vs=Vdata). Scan signal SC1(n) is low during this time, which keeps transistor Tgd deactivated. As a result, the voltage the gate of the drive transistor cannot change. By performing on-bias stress, a later sampled Vth will correspond to Vdata and will therefore be much closer to the target Ids curve. Performing the on-bias stress phase to bias the Vgs of the drive transistor with Vdata before sampling Vth can therefore help mitigate hysteresis and improve first frame response. The on-bias stress phase terminals at time t4 when scan signal SC1(n) is driven high.

At time t4, scan signal SC1(n) is driven high to reactivate gate-to-drain transistor Tgd. From time t4 to t5, transistors Tgd and Tdata are both activated. Activating transistor Tdata will load data signal D(n) into pixel 22 (e.g., by driving the data signal onto the source terminal of transistor Tdrive). Since signal SC1(n) is high, the voltage at the gate and drain terminals of transistor Tdrive will shift up or down depending on the value of D(n) while retaining a Vth difference across the gate and source terminals since the voltage has nowhere to discharge. The time period from time t4 to t5 is therefore sometimes referred to as a data programming and Vth sampling phase. The data programming period may be equal to or less than one row time.

At time t5, scan signal SC2(n) is driven low, which deactivates transistor Tdata and terminates the data programming operation. Driving scan signal SC2(n) low will simultaneously apply a lower voltage to capacitor Cx. As described above in connection with FIG. 6B, supplying a lower voltage to capacitor Cx after the data programming phase can help extend the Vth sampling time by discharging current from capacitor Cst to capacitor Cx via transistor Tgd. The time period between time t5 (when the data programming phase terminates) and time t6 (when transistor Tgd is deactivated) may therefore sometimes be referred to as the extended Vth sampling phase. The falling edge of scan signal SC1(n) can be adjusted to tune the duration of the extended Vth sampling period. At time t7, emission control signals EM(n) and EM(n+2) are both asserted (driven high) to resume the emission period.

Figure 12A:
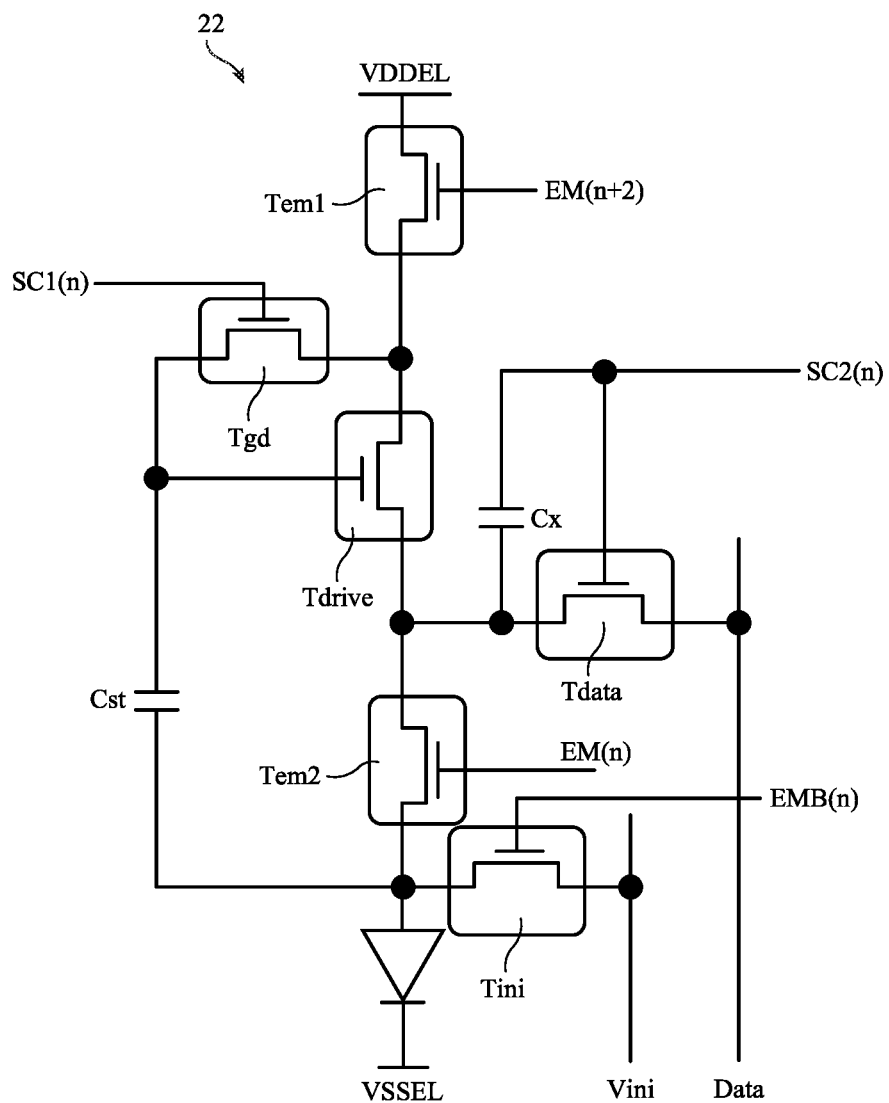
FIG. 12A is a circuit diagram of an illustrative display pixel having at least six semiconducting oxide transistors in accordance with some embodiments.

The example of FIG. 11A in which the initialization transistor Tini is implemented as a p-channel silicon transistor is merely illustrative. FIG. 12A illustrates another example where the initialization transistor Tini is implemented as a semiconducting oxide transistor. As shown in FIG. 12A, pixel 22 now includes at least six semiconducting oxide transistors (e.g., transistors Tdrive, Tgd, Tini, Tdata, Tem1, and Tem2 may all be semiconducting oxide switches). Pixel 22 of FIG. 12A does not include any silicon transistors. In particular, transistor Tini may now be controlled by emission signal EMB(n), which is an inverted version of signal EM(n). The remainder of pixel 22 is similar to FIG. 11A and need not be reiterated in detail to avoid obscuring the present embodiment.

Figure 12B:
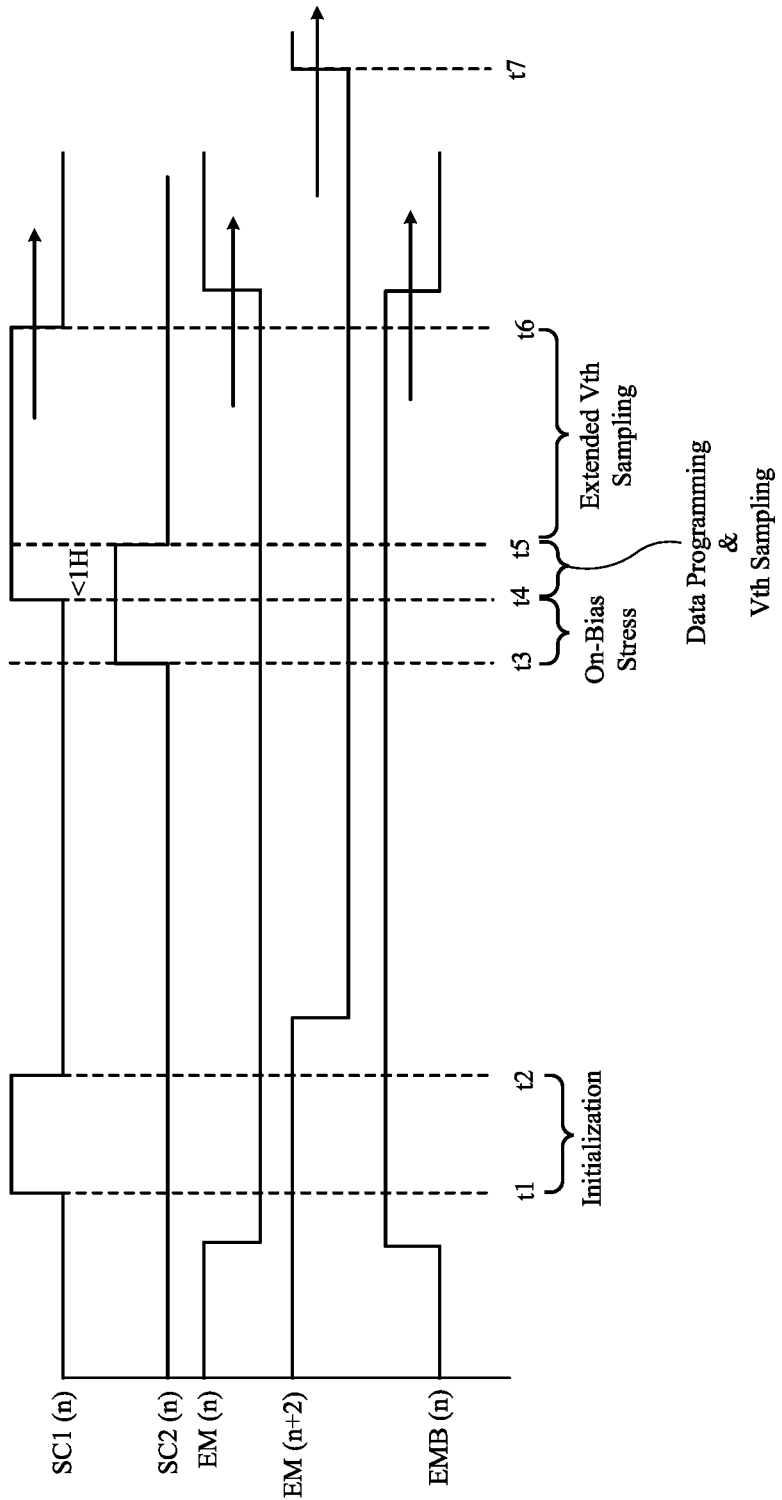
FIGS. 12B and 12C are timing diagrams showing illustrative waveforms involved in operating the display pixel of FIG. 12A in accordance with some embodiments.
Figure 12C:
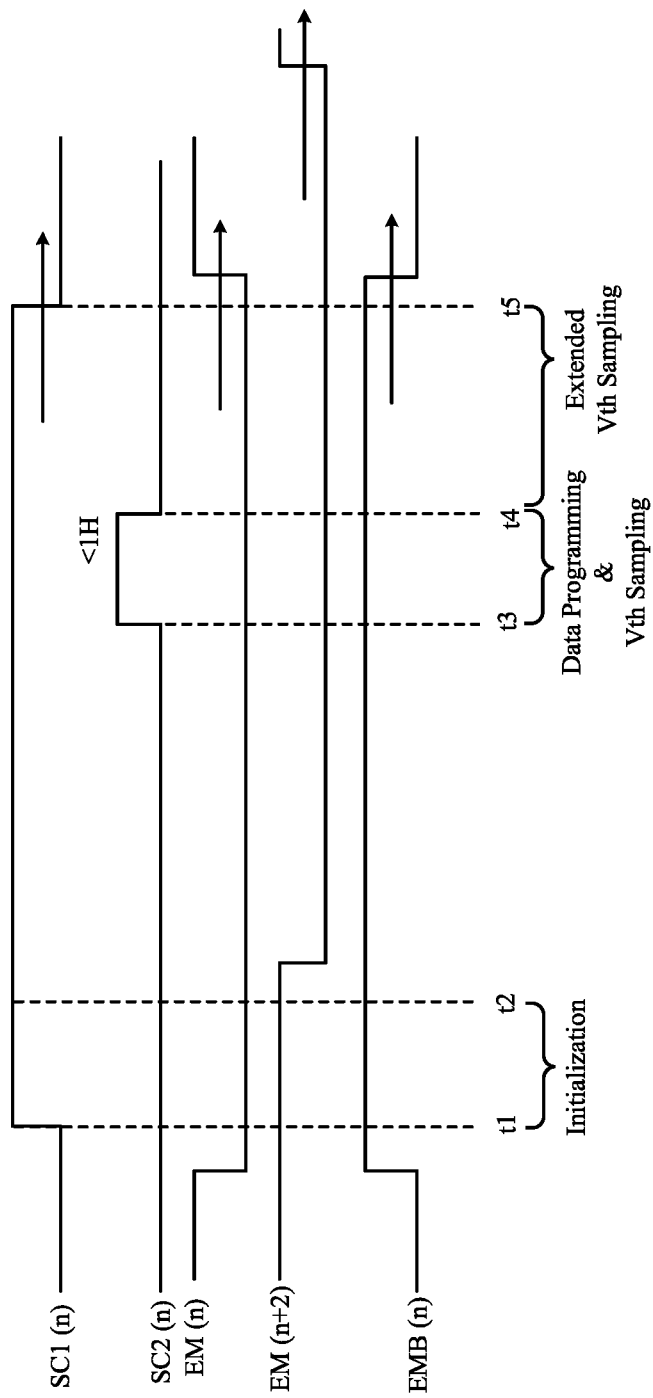

FIG. 12B is a timing diagram showing illustrative waveforms involved in operating the display pixel of FIG. 12A. The operation illustrated in FIG. 12B is similar to that already shown in FIG. 11B, except an extra signal EMB(n) is required to control transistor Tini. The example of FIG. 12B in which scan signal SC2(n) is pulsed high at time t3 to perform the on-bias stress operation is merely illustrative. FIG. 12C is a timing diagram illustrating another example where scan signal SC1(n) is continuously asserted (driven high) from time t1 until time t5. Operated in this way, there will be no on-bias stress operation prior to time t3.

Figure 13A:
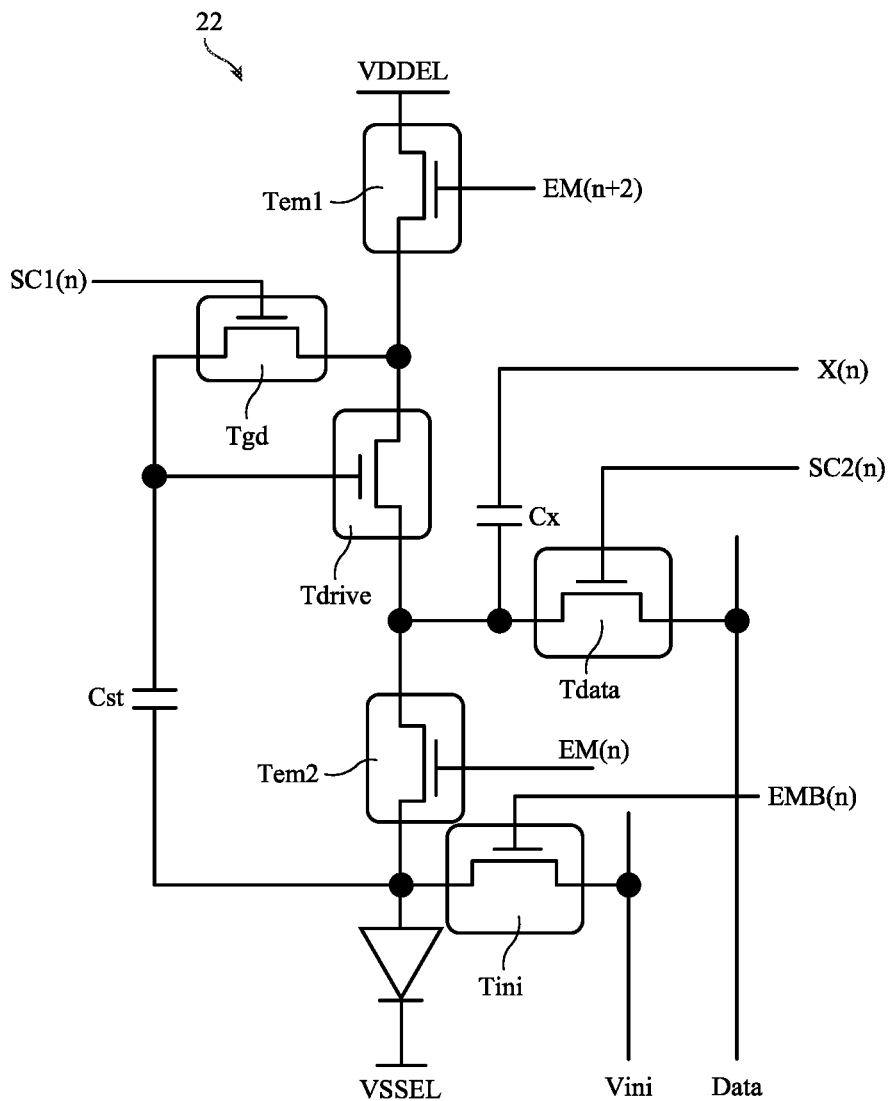
FIG. 13A is a circuit diagram of an illustrative display pixel having a data loading transistor and a threshold voltage sampling extension capacitor separately driven by peripheral gate drivers in accordance with some embodiments.
Figure 13B:
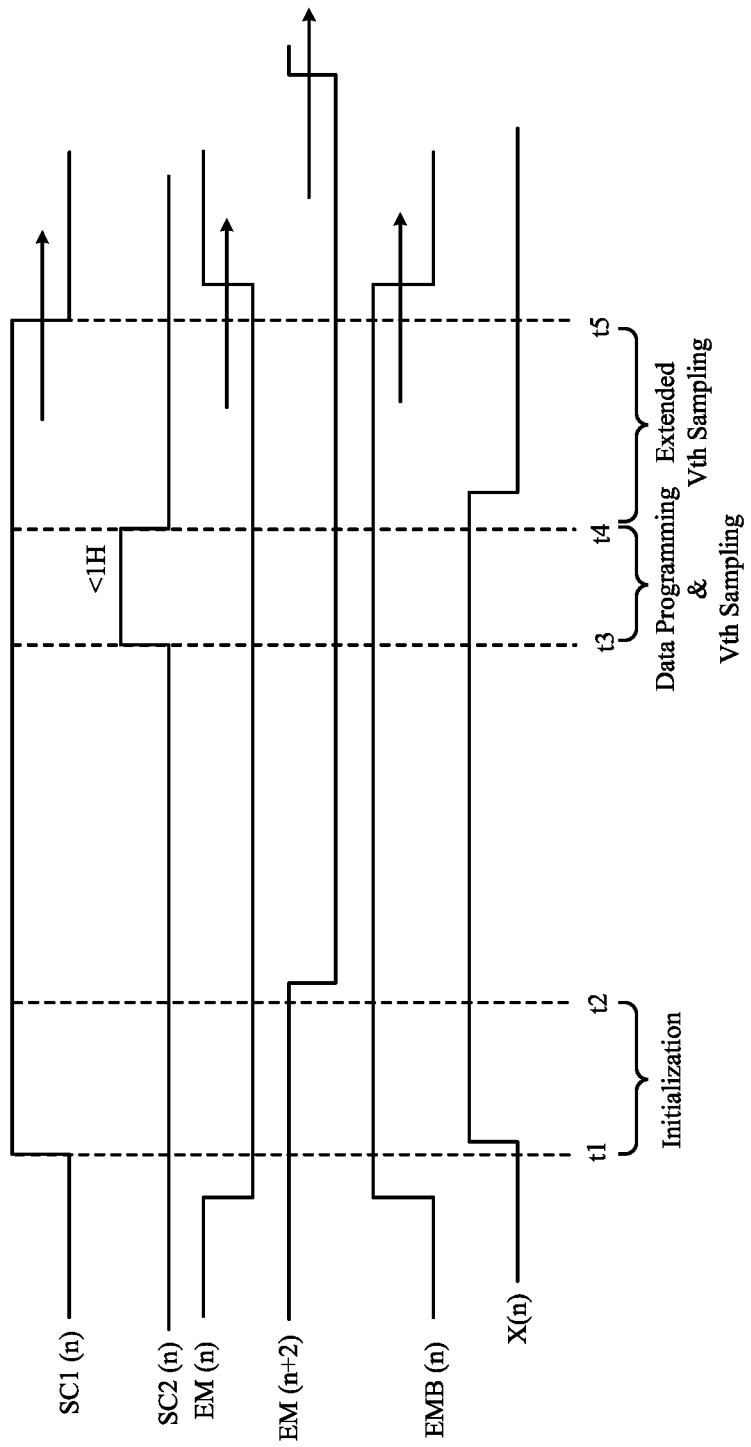
FIG. 13B is a timing diagram showing illustrative waveforms involved in operating the display pixel of FIG. 13A in accordance with some embodiments.

The example of FIG. 12A in which transistor Tdata and capacitor Cx both receive scan signal SC2(n) is merely illustrative. FIG. 13A illustrates another example where the data loading transistor Tdata and Cx receive separate signals SC2(n) and X(n), respectively, via different gate drivers. As shown in FIG. 13A, pixel 22 includes at least six semiconducting oxide transistors (e.g., all of the transistors within pixel 22 are semiconducting oxide switches). The remainder of pixel 22 is similar to FIG. 12A and need not be reiterated in detail to avoid obscuring the present embodiment. FIG. 13B is a timing diagram showing illustrative waveforms involved in operating the display pixel of FIG. 13A. The operation illustrated in FIG. 13B is similar to that already shown in FIG. 12B with an additional signal X(n) that is different than signal SC2(n). As shown in FIG. 13B, signal X(n) may be driven high around time t1 and is driven low on or after time t4 but before time t5.

Figure 14A:
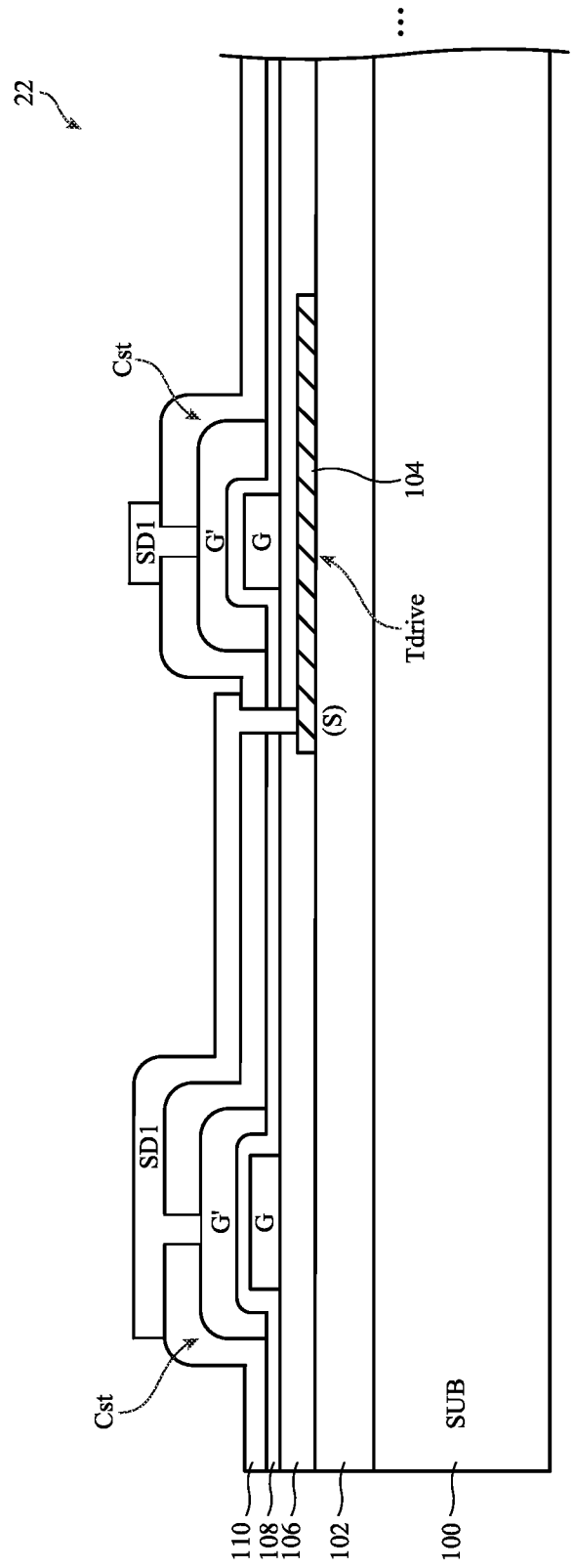
FIG. 14A-14E are cross-sectional side views of a display stackup showing at least a drive transistor, a storage capacitor, and a threshold voltage sampling extension capacitor in accordance with some embodiments.

FIG. 14A is a cross-sectional side view of a display pixel 22 having a first storage capacitor Cst and a second Vth sampling extension capacitor Cx (see, e.g., illustrative pixels 22 of FIGS. 6-13). As shown in FIG. 14A, the display may have a stackup that includes a substrate layer such as substrate 100. Substrate 100 may optionally be covered with one or more buffer layers 102. Buffer layer(s) 102 may include inorganic buffer layers such as layers of silicon oxide, silicon nitride, or other passivation or dielectric material.

A semiconducting oxide layer 104 may be formed on buffer layer 102. A semiconducting oxide layer is defined as an oxide layer that is formed from a semiconductor such as IGZO, IGTZO, ITO, ITZO, or other semiconductor material. Oxide layer 104 may be patterned to form respective channel portions of semiconducting oxide transistors such as transistor Tdrive. A gate insulating layer such as layer 106 may be formed over oxide layer 104. Gate insulating layer 106 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material.

A top gate conductive layer such as gate layer G may be formed on gate insulating layer 106. Top gate conductors G may be formed from molybdenum, titanium, aluminum, nickel, chromium, copper, silver, gold, a combination of these materials, other metals, or other suitable gate conductor material. In the example of FIG. 5, semiconducting oxide layer 104 and a portion of the gate conductor layer directly above layer 104 collectively forms transistor Tdrive (as an example).

A first interlayer dielectric (ILD) layer 108 may be formed over gate conductor G. A second gate conductor layer such as gate layer G' may be formed on layer 108. Gate conductor G' may also be formed from molybdenum, titanium, aluminum, nickel, chromium, copper, silver, gold, a combination of these materials, other metals, or other suitable gate conductor material. A second interlayer dielectric (ILD) layer 110 may be formed over gate conductor G'.

A first source-drain metal routing layer SD1 may be formed on layer 110. The SD1 metal routing layer may be formed from aluminum, nickel, chromium, copper, molybdenum, titanium, silver, gold, a combination of these materials (e.g., a multilayer stackup of Ti/Al/Ti), other metals, or other suitable metal routing conductors. The SD1 metal routing layer may be patterned and/or etch to form SD1 metal routing paths.

In the example of FIG. 14A, capacitor Cst may be formed directly above transistor Tdrive. In particular, capacitor Cst may have a bottom capacitor plate formed from a portion of the first gate conductor layer G and a top capacitor plate formed from a portion of the second gate conductor layer G'. Layers G and G" may sometimes be referred to as first and second metal layers, respectively. Capacitor Cx may be formed lateral to capacitor Cst. As shown in FIG. 14A, capacitor Cx may have a bottom capacitor plate formed from another portion of the first gate conductor layer G and a top capacitor plate formed from another portion of the second gate conductor layer G'. The top capacitor terminal of Cx may be coupled to the source terminal (S) of the drive transistor via SD1 routing.

Figure 14B:
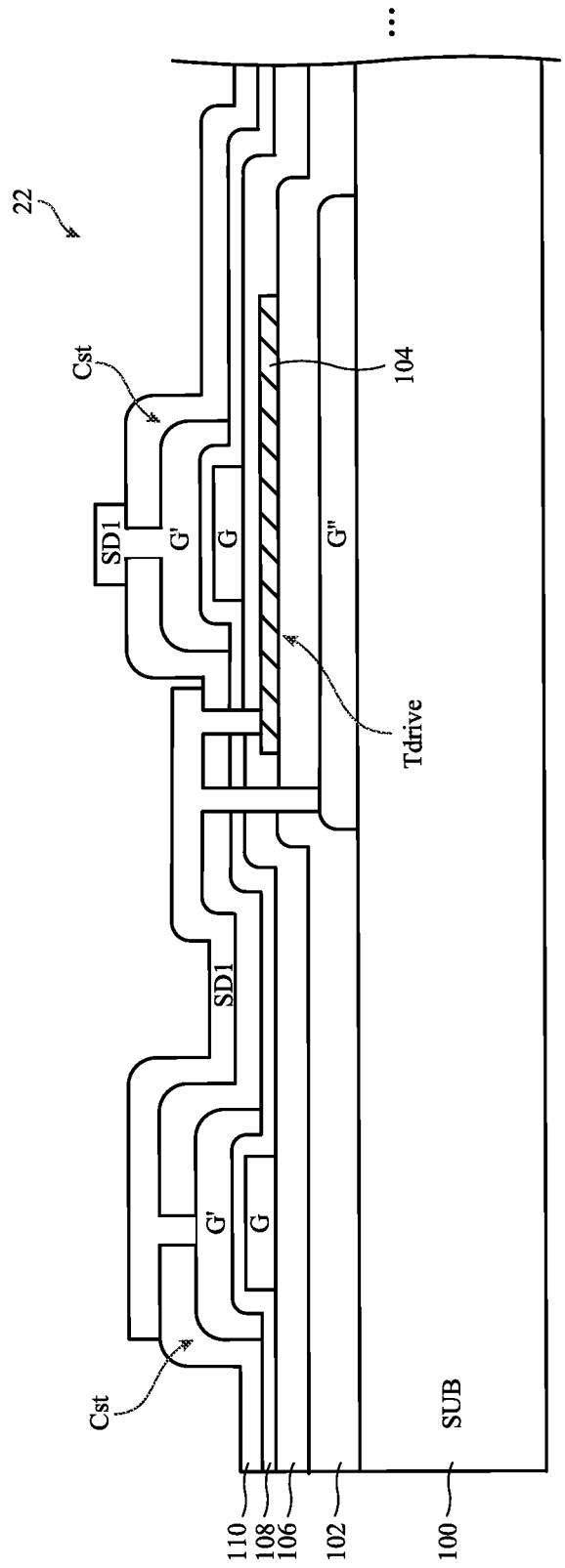

FIG. 14B shows another embodiment having a backside conductor G" formed underneath the semiconducting oxide layer 104. As shown in FIG. 14B, backside conductor G" may be formed on substrate 100 and under buffer layer 102. Conductor G" may be formed using molybdenum, aluminum, nickel, chromium, copper, titanium, silver, gold, a combination of these materials, other metals, or other suitable conductive material. Conductor G" may therefore sometimes be referred to as a third metal layer. Conductor G" may be configured as a shielding layer to block fringing electric fields from adjacent nodes in the pixel (e.g., to shield the backside channel from potentially interfering electric field). If desired, conductor G" may also serve as a backside gate conductor for the drive transistor. Conductor G" may be shorted to the source terminal of the drive transistor via the SD1 metal routing to reduce pixel crosstalk and to reduce potential non-uniformity issues.

Figure 14C:
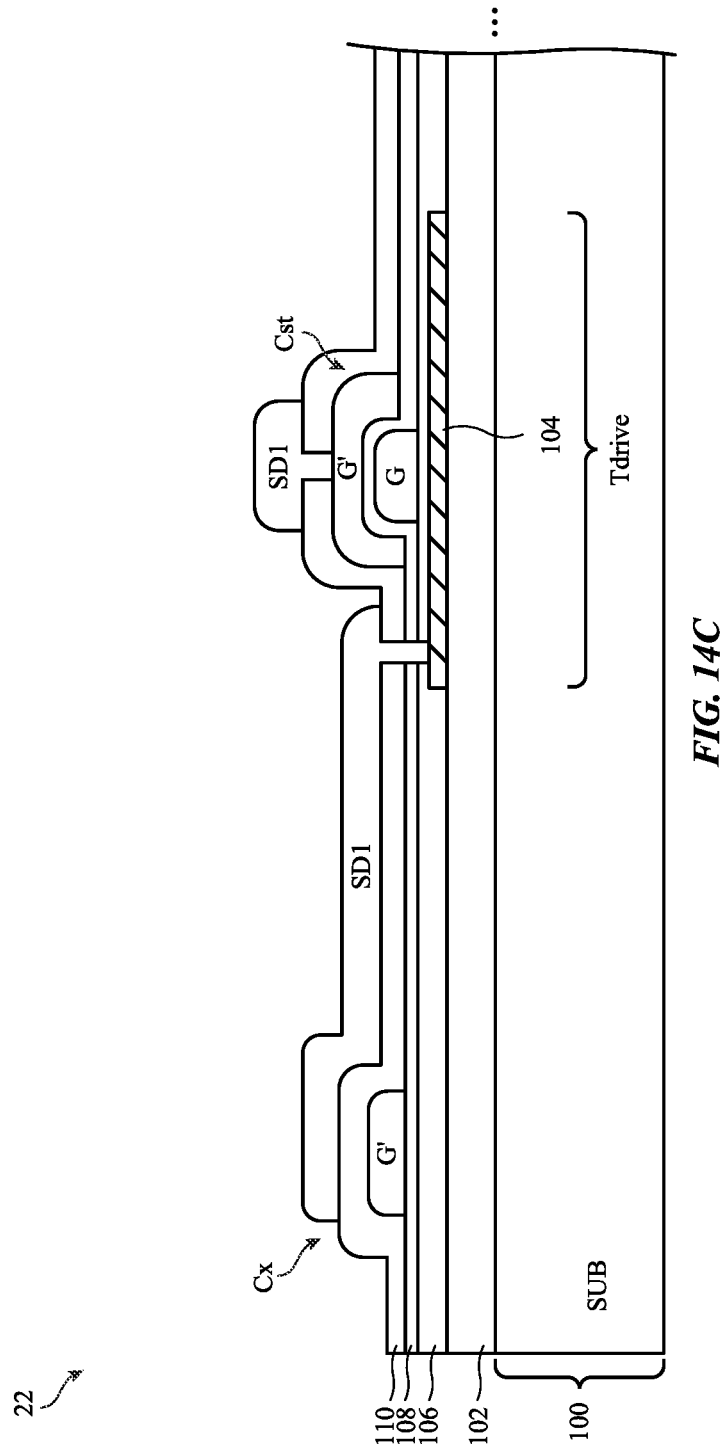

The example of FIG. 14A in which capacitor Cx is formed using metal layers G and G' is merely illustrative. FIG. 14C shows another embodiment where capacitor Cx is formed using other layers in the display stackup. As shown in FIG. 14C, capacitor Cx may have a bottom capacitor plate formed from a portion of metal layer G' and a top capacitor plate formed from a portion of the SD1 metal layer. The remainder of FIG. 14B is substantially similar to FIG. 14A and need not be reiterated in detail to avoid obscuring the present embodiment.

Figure 14D:
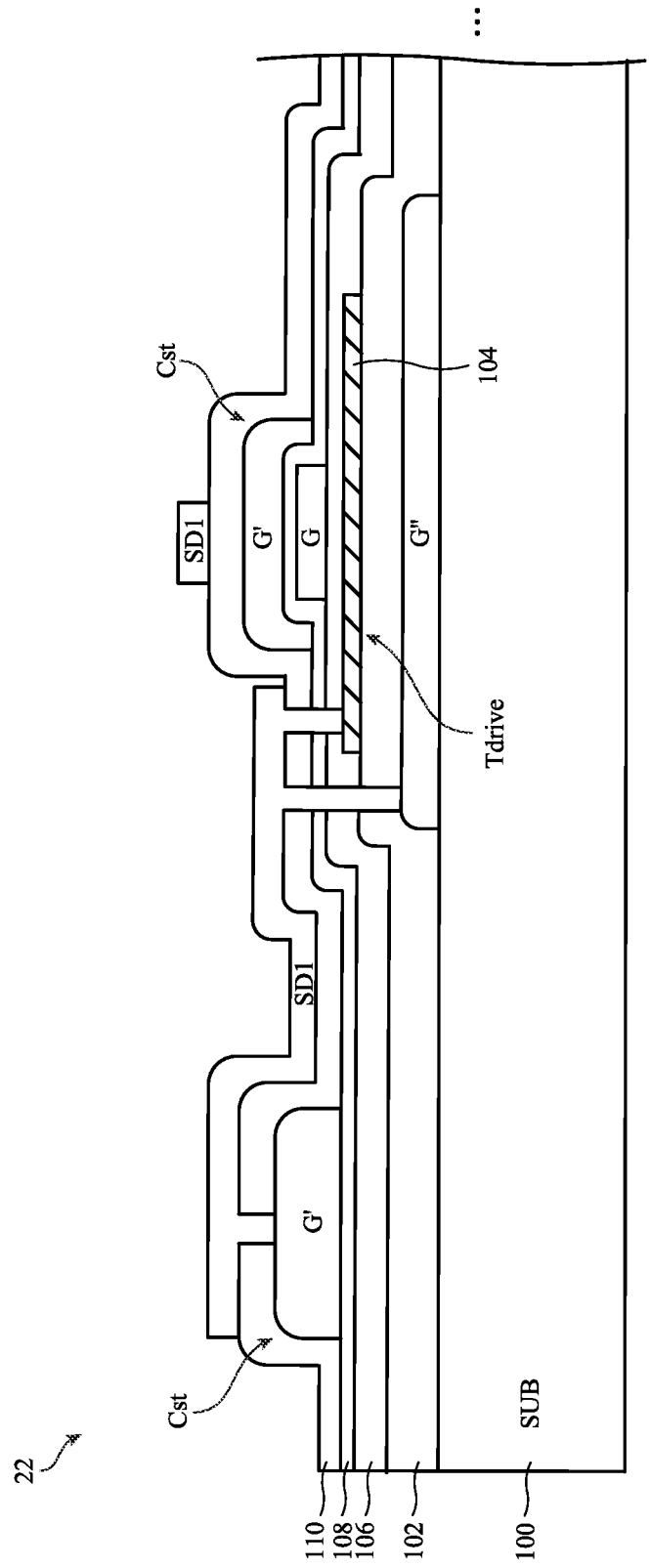

The example of FIG. 14B in which capacitor Cx is formed using metal layers G and G' is merely illustrative. FIG. 14D shows another embodiment where capacitor Cx is formed using other layers in the display stackup. As shown in FIG. 14D, capacitor Cx may have a bottom capacitor plate formed from a portion of metal layer G' and a top capacitor plate formed from a portion of the SD1 metal layer. The remainder of FIG. 14D is substantially similar to FIG. 14B and need not be reiterated in detail to avoid obscuring the present embodiment.

Figure 14E:
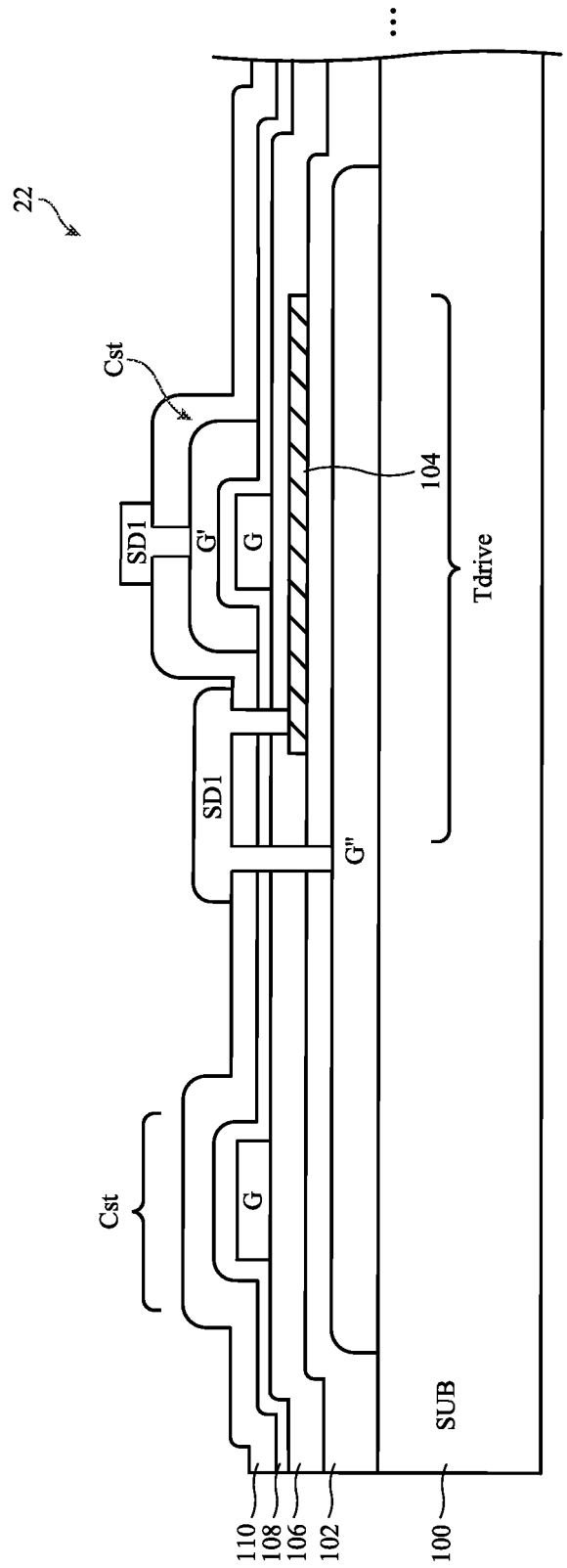

The example of FIG. 14D in which backside conductor G" is formed directly below the drive transistor is merely illustrative. FIG. 14E shows another embodiment where the backside conductor G" extends beyond the drive transistor. As shown in FIG. 14E, capacitor Cx may have a bottom capacitor plate formed using the extended backside conductor G" and a top capacitor plate formed from a portion of metal layer G. In other words, a first portion of backside conductor layer G" serves as a bottom shield/gate for the drive transistor, whereas a second portion of backside conductor layer G' serves as the bottom plate for capacitor Cx. The remainder of FIG. 14E is substantially similar to FIG. 14D and need not be reiterated in detail to avoid obscuring the present embodiment. If desired, the top plate of capacitor Cx can instead be formed using second metal layer G' or the SD1 metal layer.

Figure 15A:
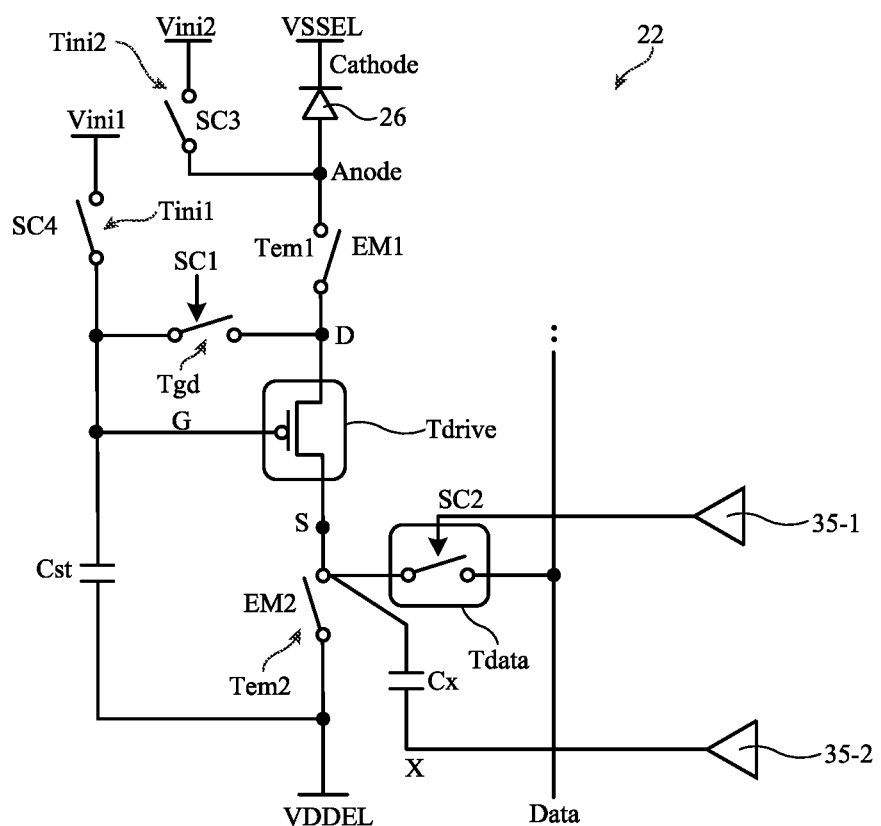
FIGS. 15A and 15B are circuit diagrams of an illustrative display pixel having a p-type drive transistor that is coupled to a light-emitting diode having a common cathode terminal in accordance with some embodiments.

The example of pixel 22 in FIG. 6A where the drive transistor is an n-type (n-channel) transistor and where diode 26 has a cathode terminal coupled to the VSSEL power supply line is merely illustrative. FIG. 15A illustrates another embodiment where display pixel 22 includes a p-type (p-channel) drive transistor that is coupled to diode 26 having a common cathode terminal (i.e., diode 26 has a cathode electrode coupled to the common VSSEL ground power supply line). As shown in FIG. 15A, at least drive transistor Tdrive and data loading transistor Tdata may be semiconducting oxide transistors. Capacitor Cst may have a first terminal coupled to the gate terminal of transistor Tdrive and a second terminal coupled to the VDDEL power supply line.

Pixel 22 may include a first initialization switch (transistor) Tini1 having a first source-drain terminal coupled to the gate terminal of transistor Tdrive and a second source-drain terminal coupled to a first initialization line configured to receive a first initialization voltage Vini1. Pixel 22 may also include a second initialization switch (transistor) Tini2 having a first source-drain terminal coupled to the anode electrode of diode 26 and a second source-drain terminal coupled to a second initialization line configured to receive a second initialization voltage Vini2. Initialization transistors Tini1 and Tini2 may be controlled using scan control signals SC4 and SC3, respectively. Pixel 22 may include a first emission switch (transistor) Tem1 coupled in series between the anode electrode and the drain terminal of transistor Tdrive and may include a second emission switch (transistor) Tem2 coupled in series between the source terminal of transistor Tdrive and the VDDEL power supply line.

Transistor Tdata and capacitor Cx are coupled to the source terminal of the drive transistor. Although transistors Tdata and capacitor Cx are shown as being separately driven by gate drivers 35-1 and 35-2, respectively, signals X and SC2 can be driven using the same gate driver (see, e.g., FIGS. 7B and 7C) if scan signals SC1 and SC2 have the same polarity (i.e., both SC1 and SC2 are driven high or low to turn on transistors Tgd and Tdata, respectively). In general, switches Tem1, Tem2, Tini1, Tini2, and/or Tdata can each be implemented as a semiconducting oxide transistor, an n-channel silicon transistor, or a p-channel silicon transistor.

Figure 15B:
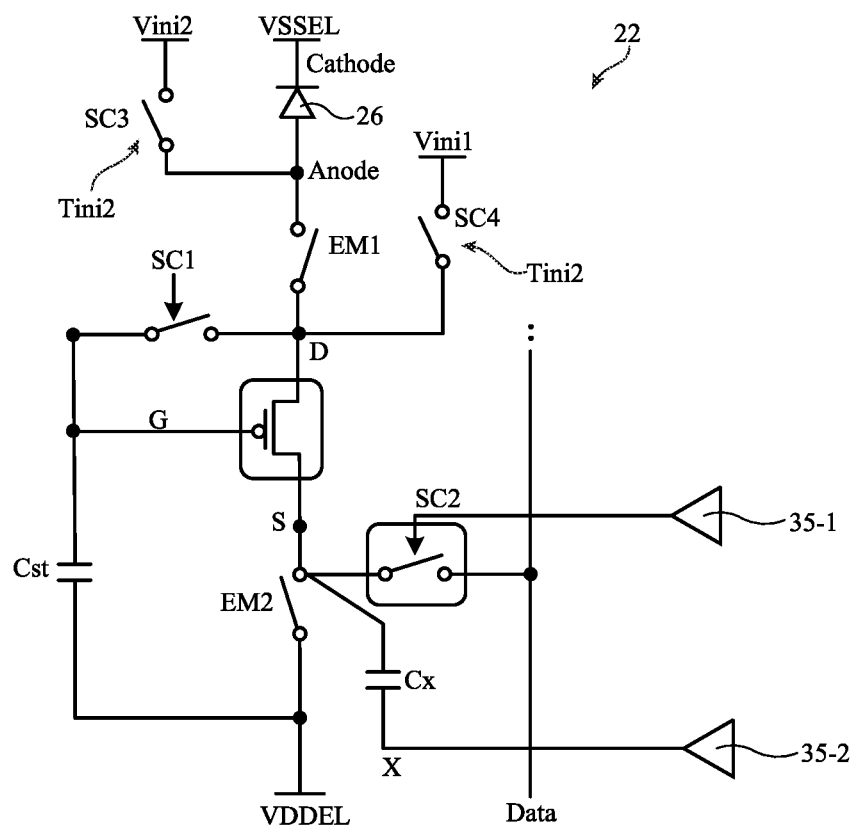

The embodiment of FIG. 15A in which the first initialization transistor Tini1 is coupled to the gate terminal of transistor Tdrive is merely illustrative. FIG. 15B shows another embodiment where initialization transistor Tini1 has a first source-drain terminal coupled to the drain terminal of transistor Tdrive, has a second source-drain terminal configured to receive voltage Vini1, and has a gate terminal configured to receive scan signal SC4. The remainder of pixel 22 has a structure similar to that already described in connection with FIG. 15A and need not be reiterated in detail to avoid obscuring the present embodiment.

Figure 16A:
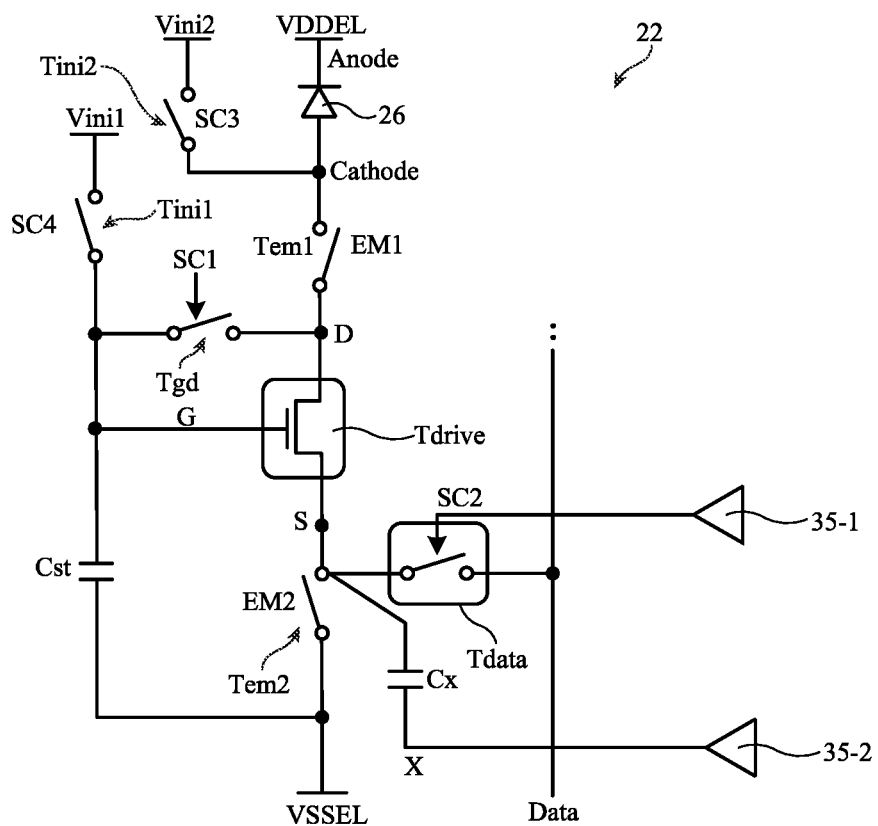
FIGS. 16A and 16B are circuit diagrams of an illustrative display pixel having an n-type drive transistor that is coupled to a light-emitting diode having a common anode terminal in accordance with some embodiments.

The example of pixel 22 in FIGS. 15A and 15B where diode 26 has a cathode terminal coupled to the VSSEL power supply line is merely illustrative. FIG. 16A illustrates another embodiment where display pixel 22 includes an n-type drive transistor that is coupled to diode 26 having a common anode terminal (i.e., diode 26 has an anode electrode coupled to the common VDDEL positive power supply line). As shown in FIG. 16A, at least drive transistor Tdrive and data loading transistor Tdata may be semiconducting oxide transistors. Capacitor Cst may have a first terminal coupled to the gate terminal of transistor Tdrive and a second terminal coupled to the VSSEL ground power supply line.

Pixel 22 may include a first initialization switch (transistor) Tini1 having a first source-drain terminal coupled to the gate terminal of transistor Tdrive and a second source-drain terminal coupled to a first initialization line configured to receive a first initialization voltage Vini1. Pixel 22 may also include a second initialization switch (transistor) Tini2 having a first source-drain terminal coupled to the cathode electrode of diode 26 and a second source-drain terminal coupled to a second initialization line configured to receive a second initialization voltage Vini2. Initialization transistors Tini1 and Tini2 may be controlled using scan control signals SC4 and SC3, respectively. Pixel 22 may include a first emission switch (transistor) Tem1 coupled in series between the cathode electrode and the drain terminal of transistor Tdrive and may include a second emission switch (transistor) Tem2 coupled in series between the source terminal of transistor Tdrive and the VSSEL power supply line.

Transistor Tdata and capacitor Cx are coupled to the source terminal of the drive transistor. Although transistors Tdata and capacitor Cx are shown as being separately driven by gate drivers 35-1 and 35-2, respectively, signals X and SC2 can be driven using the same gate driver (see, e.g., FIGS. 7B and 7C) if scan signals SC1 and SC2 have the same polarity (i.e., both SC1 and SC2 are driven high or low to turn on transistors Tgd and Tdata, respectively). In general, switches Tem1, Tem2, Tini1, Tini2, and/or Tdata can each be implemented as a semiconducting oxide transistor, an n-channel silicon transistor, or a p-channel silicon transistor.

Figure 16B:
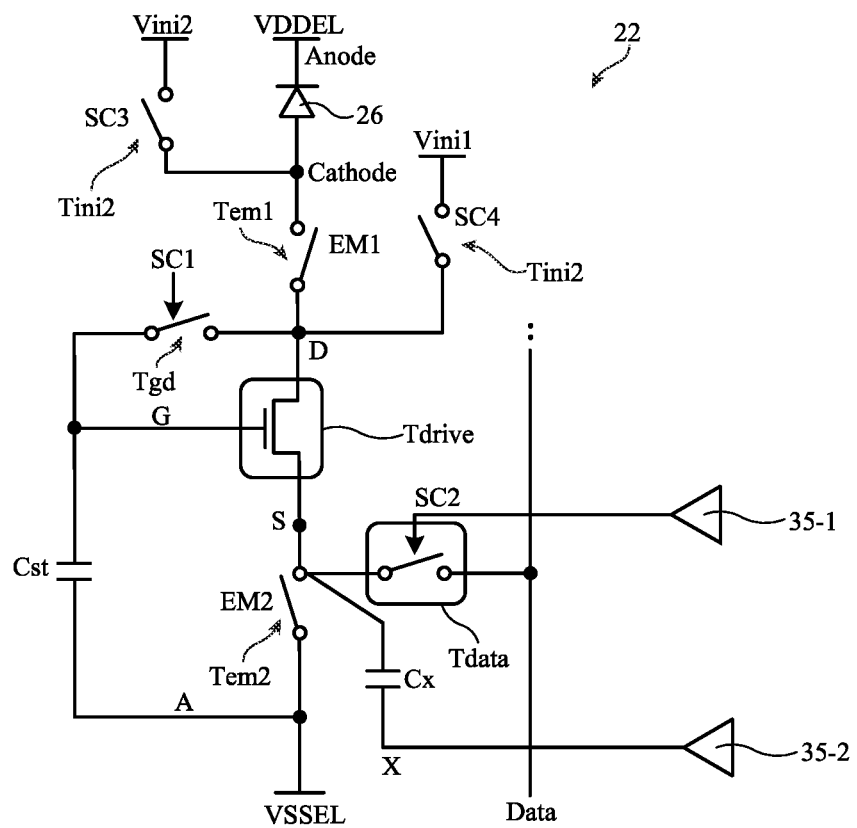

The embodiment of FIG. 16A in which the first initialization transistor Tini1 is coupled to the gate terminal of transistor Tdrive is merely illustrative. FIG. 16B shows yet another embodiment where initialization transistor Tini1 has a first source-drain terminal coupled to the drain terminal of transistor Tdrive, has a second source-drain terminal configured to receive voltage Vini1, and has a gate terminal configured to receive scan signal SC4. The remainder of pixel 22 has a structure similar to that already described in connection with FIG. 16A and need not be reiterated in detail to avoid obscuring the present embodiment.

Figure 17:
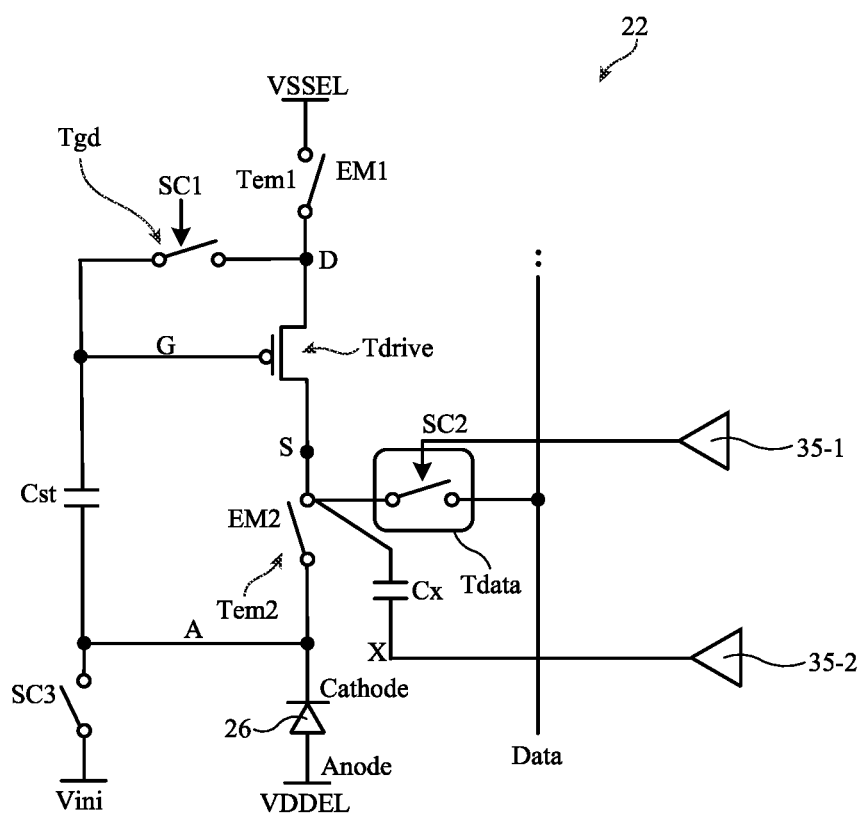
FIG. 17 is a circuit diagram of an illustrative display pixel having a p-type drive transistor that is coupled to a light-emitting diode having a common anode terminal in accordance with some embodiments.

The example of pixel 22 in FIGS. 16A and 16B where the drive transistor is an n-type transistor is merely illustrative. FIG. 17 illustrates yet another embodiment where display pixel 22 includes a p-type drive transistor that is coupled to diode 26 having a common anode terminal (i.e., diode 26 has an anode electrode coupled to the common VDDEL positive power supply line). As shown in FIG. 17, at least data loading transistor Tdata may be a semiconducting oxide transistor. Capacitor Cst may have a first terminal coupled to the gate terminal of transistor Tdrive and a second terminal coupled to the cathode terminal.

Pixel 22 may include an initialization switch (transistor) Tini having a first source-drain terminal coupled to the cathode electrode and a second source-drain terminal coupled to an initialization line configured to receive initialization voltage Vini. Pixel 22 may optionally include one or more additional initialization transistors coupled to the cathode terminal or some other internal node within pixel 22. Initialization transistor Tini may be controlled using scan control signal SC3. Pixel 22 may include a first emission switch (transistor) Tem1 coupled in series between the VSSEL power supply line and the drain terminal of Tdrive and may include a second emission switch (transistor) Tem2 coupled in series between the source terminal of transistor Tdrive and the cathode electrode.

Transistor Tdata and capacitor Cx are coupled to the source terminal of the drive transistor. Although transistors Tdata and capacitor Cx are shown as being separately driven by gate drivers 35-1 and 35-2, respectively, signals X and SC2 can be driven using the same gate driver (see, e.g., FIGS. 7B and 7C) if scan signals SC1 and SC2 have the same polarity (i.e., both SC1 and SC2 are driven high or low to turn on transistors Tgd and Tdata, respectively). In general, transistors Tdrive, Tem1, Tem2, Tini, and/or Tdata can each be implemented as a semiconducting oxide transistor, an n-channel silicon transistor, or a p-channel silicon transistor.

The foregoing is merely illustrative and various modifications can be made to the described embodiments. The foregoing embodiments may be implemented individually or in any combination.

What is claimed is:
1. A display pixel comprising:
a light-emitting diode;
a drive transistor coupled in series with the light-emitting diode;
a first capacitor having a first terminal coupled to a gate terminal of the drive transistor and having a second terminal coupled to an anode of the light-emitting diode;

a second capacitor having a first terminal coupled to a source terminal of the drive transistor and having a second terminal configured to receive an adjustable voltage signal; and a data loading transistor coupled to the source terminal of the drive transistor and configured to receive the adjustable voltage signal or a scan control signal separate from the adjustable voltage signal.

2. The display pixel of claim 1, further comprising:
a first gate driver having an output coupled to a gate terminal of the data loading transistor; and
a second gate driver having an output coupled to the second terminal of the second capacitor.

3. The display pixel of claim 2, further comprising:
a first emission transistor coupled between a power supply line and a drain terminal of the drive transistor;
a second emission transistor coupled between the source terminal of the drive transistor and the anode of the light-emitting diode;
a gate-to-drain transistor coupled between the drain terminal and the gate terminal of the drive transistor; and
an initialization transistor having a first terminal coupled to the anode of the light-emitting diode and a second terminal coupled to an initialization line.

4. The display pixel of claim 3, wherein the second emission transistor is configured to receive an emission signal and wherein the initialization transistor is configured to receive the emission signal.

5. The display pixel of claim 4, wherein the first emission transistor is configured to receive an additional emission signal from another display pixel in a different row.

6. The display pixel of claim 3, wherein:
the drive transistor, the gate-to-drain transistor, the data loading transistor, and the initialization transistor comprise semiconducting oxide transistors; and
the first emission transistor and the second emission transistor comprise p-type silicon transistors.

7. The display pixel of claim 1, further comprising:
a gate driver having an output coupled to the second terminal of the second capacitor and coupled to a gate terminal of the data loading transistor.

8. The display pixel of claim 7, further comprising:
a first emission transistor coupled between a power supply line and a drain terminal of the drive transistor;
a second emission transistor coupled between the source terminal of the drive transistor and the anode of the light-emitting diode;
a gate-to-drain transistor coupled between the drain terminal and the gate terminal of the drive transistor; and
an initialization transistor having a first terminal coupled to the anode of the light-emitting diode and a second terminal coupled to an initialization line.

9. The display pixel of claim 8, wherein the drive transistor comprises an n-type silicon transistor and wherein the data loading transistor comprises a semiconducting oxide transistor.

10. The display pixel of claim 9, wherein the gate-to-drain transistor comprises an n-type silicon transistor.

11. The display pixel of claim 1, further comprising:
a first emission transistor coupled between a power supply line and a drain terminal of the drive transistor;
a second emission transistor coupled between the source terminal of the drive transistor and the anode of the light-emitting diode;
a gate-to-drain transistor coupled between the drain terminal and the gate terminal of the drive transistor; and
an initialization transistor having a first terminal coupled to the anode of the light-emitting diode and a second terminal coupled to an initialization line.

12. The display pixel of claim 11, wherein:
the drive transistor, the gate-to-drain transistor, the data loading transistor, and the initialization transistor comprise semiconducting oxide transistors; and
the first emission transistor and the second emission transistor comprise p-type silicon transistors.

13. The display pixel of claim 1, wherein the data loading transistor is configured to receive the adjustable voltage signal via a first row line, and wherein the second capacitor is configured to receive the adjustable voltage signal via a second row line separate from the first row line.

14. The display pixel of claim 1, wherein the data loading transistor is configured to receive the adjustable voltage signal via a row line, and wherein the second capacitor is configured to receive the adjustable voltage signal via the row line.

15. A display pixel comprising:
a light-emitting diode;
a drive transistor coupled in series with the light-emitting diode;
a first emission transistor coupled between a power supply line and a first source-drain terminal of the drive transistor;
a second emission transistor coupled between a second source-drain terminal of the drive transistor and an anode of the light-emitting diode and configured to receive an emission signal;
a gate-to-drain transistor coupled between a gate terminal and the first source-drain terminal of the drive transistor;
a data loading transistor coupled to the second source-drain terminal of the drive transistor;
an initialization transistor coupled to the anode terminal of the light-emitting diode and configured to receive the emission signal;
a first capacitor having a first terminal coupled to the gate terminal of the drive transistor and having a second terminal coupled to the anode of the light-emitting diode; and
a second capacitor having a first terminal coupled to the second source-drain terminal of the drive transistor and having a second terminal configured to receive a control voltage via a row line.

* * * * *